US007089519B1

(12) United States Patent
Teig

(10) Patent No.: US 7,089,519 B1
(45) Date of Patent: Aug. 8, 2006

(54) METHOD AND SYSTEM FOR PERFORMING PLACEMENT ON NON MANHATTAN SEMICONDUCTOR INTEGRATED CIRCUITS

(75) Inventor: Steven Teig, Menlo Park, CA (US)

(73) Assignee: Cadence Design System, Inc., San Jose, CA (US)

( * ) Notice: Subject to any disclaimer, the term of this patent is extended or adjusted under 35 U.S.C. 154(b) by 0 days.

(21) Appl. No.: 10/335,055

(22) Filed: Dec. 31, 2002

(51) Int. Cl.
 *G06F 17/50* (2006.01)
(52) U.S. Cl. .................. 716/9; 716/2; 716/7; 716/8; 716/11
(58) Field of Classification Search .............. 716/1, 716/2, 5–8, 10–13, 16, 17, 19; 257/785
 See application file for complete search history.

(56) References Cited

U.S. PATENT DOCUMENTS

| 4,593,363 | A | | 6/1986 | Burstein et al. |
|---|---|---|---|---|
| 4,615,011 | A | | 9/1986 | Linsker |
| 4,777,606 | A | | 10/1988 | Fournier |
| 4,855,929 | A | | 8/1989 | Nakajima |
| 5,097,422 | A | | 3/1992 | Corbin, II et al. |
| 5,224,057 | A | | 6/1993 | Igarashi et al. |
| 5,267,176 | A | | 11/1993 | Antreich et al. |
| 5,375,069 | A | | 12/1994 | Satoh et al. |
| 5,452,224 | A | * | 9/1995 | Smith et al. ............... 716/19 |
| 5,519,836 | A | | 5/1996 | Gawlick et al. |
| 5,532,934 | A | | 7/1996 | Rostoker |
| 5,566,078 | A | | 10/1996 | Ding et al. |
| 5,578,840 | A | | 11/1996 | Scepanovic et al. |
| 5,587,923 | A | | 12/1996 | Wang |
| 5,618,744 | A | | 4/1997 | Suzuki et al. |
| 5,633,479 | A | | 5/1997 | Hirano |
| 5,634,093 | A | | 5/1997 | Ashida et al. |
| 5,636,125 | A | | 6/1997 | Rostoker et al. |
| 5,637,920 | A | | 6/1997 | Loo |

(Continued)

FOREIGN PATENT DOCUMENTS

JP          64-15947          1/1989

(Continued)

OTHER PUBLICATIONS

Cho et al., "Wirimg space and length estimation in two-dimensional arrays", May, 2000; Computer-Aided Design of Integrated Circuits ans Systems, IEEE Tranasactions on, vol. 19, Issue: 5, pp. 612-615.*

(Continued)

*Primary Examiner*—A. M. Thompson
*Assistant Examiner*—Helen Rossoshek
(74) *Attorney, Agent, or Firm*—Stattler, Johansen & Adeli, LLP

(57) ABSTRACT

The present invention introduces methods of creating floor plans and placements for non Manhattan integrated circuits with existing electronic design automation tools. To create a floor plan, an existing Manhattan based floor planning tool is used. The die size for the floor plan is reduced to take into account the improved wiring density of non Manhattan wiring. A non Manhattan global router is then used on the floor plan to create pin placements. The floor plan may create a floor plan having circuit modules with beveled corners to take advantage of diagonal wiring. To create a placement, an existing Manhattan based placer is first used to create an initial placement. The initial placement is then processed by a non Manhattan aware post processor. The post processor performs local optimizations on the initial placement to improve the placement for a non Manhattan routed integrated circuit.

18 Claims, 14 Drawing Sheets

U.S. PATENT DOCUMENTS

| | | |
|---|---|---|
| 5,640,327 A | 6/1997 | Ting |
| 5,650,653 A | 7/1997 | Rostoker et al. |
| 5,663,891 A | 9/1997 | Bamji et al. |
| 5,699,265 A | 12/1997 | Scepanovic et al. |
| 5,742,086 A | 4/1998 | Rostoker et al. |
| 5,757,089 A | 5/1998 | Ishizuka |
| 5,757,656 A | 5/1998 | Hershberger et al. |
| 5,777,360 A | 7/1998 | Rostoker et al. |
| 5,784,289 A | 7/1998 | Wang |
| 5,798,936 A | 8/1998 | Cheng |
| 5,811,863 A | 9/1998 | Rostoker et al. |
| 5,822,214 A * | 10/1998 | Rostoker et al. ............ 716/10 |
| 5,838,583 A | 11/1998 | Varadarajan et al. |
| 5,859,449 A | 1/1999 | Kobayashi et al. |
| 5,889,677 A | 3/1999 | Yasuda et al. |
| 5,898,597 A | 4/1999 | Scepanovic et al. |
| 5,914,887 A | 6/1999 | Scepanovic et al. |
| 5,973,376 A | 10/1999 | Rostoker et al. |
| 5,980,093 A | 11/1999 | Jones et al. |
| 6,018,623 A | 1/2000 | Chang et al. |
| 6,035,108 A * | 3/2000 | Kikuchi ..................... 716/2 |
| 6,038,385 A | 3/2000 | Scepanovic et al. |
| 6,058,254 A | 5/2000 | Scepanovic et al. |
| 6,068,662 A | 5/2000 | Scepanovic et al. |
| 6,070,108 A | 5/2000 | Andreev et al. |
| 6,085,032 A | 7/2000 | Scepanovic et al. |
| 6,088,519 A | 7/2000 | Koford |
| 6,123,736 A | 9/2000 | Pavisic et al. |
| 6,128,767 A | 10/2000 | Chapman |
| 6,134,702 A | 10/2000 | Scepanovic et al. |
| 6,154,873 A | 11/2000 | Takahashi |
| 6,155,725 A | 12/2000 | Scepanovic et al. |
| 6,175,950 B1 | 1/2001 | Scepanovic et al. |
| 6,209,123 B1 | 3/2001 | Maziasz et al. |
| 6,216,252 B1 | 4/2001 | Dangelo et al. |
| 6,230,306 B1 | 5/2001 | Raspopovic et al. |
| 6,240,541 B1 | 5/2001 | Yasuda et al. |
| 6,247,167 B1 | 6/2001 | Raspopovic et al. |
| 6,249,902 B1 | 6/2001 | Igusa et al. |
| 6,253,363 B1 | 6/2001 | Gasanov et al. |
| 6,260,179 B1 | 7/2001 | Ohsawa et al. |
| 6,262,487 B1 * | 7/2001 | Igarashi et al. ............ 257/758 |
| 6,289,495 B1 | 9/2001 | Raspopovic et al. |
| 6,295,634 B1 | 9/2001 | Matsumoto |
| 6,301,686 B1 * | 10/2001 | Kikuchi et al. ............. 716/2 |
| 6,317,864 B1 * | 11/2001 | Kikuchi et al. ............ 716/11 |
| 6,324,674 B1 | 11/2001 | Andreev et al. |
| 6,324,675 B1 | 11/2001 | Dutta et al. |
| 6,327,693 B1 | 12/2001 | Cheng et al. |
| 6,327,694 B1 | 12/2001 | Kanazawa |
| 6,330,707 B1 | 12/2001 | Shinomiya et al. |
| 6,349,403 B1 | 2/2002 | Dutta et al. |
| 6,366,279 B1 | 4/2002 | Gorman et al. |
| 6,378,121 B1 | 4/2002 | Hiraga |
| 6,385,758 B1 | 5/2002 | Kikuchi et al. |
| 6,401,234 B1 | 6/2002 | Alpert et al. |
| 6,405,358 B1 | 6/2002 | Nuber |
| 6,407,434 B1 | 6/2002 | Rostoker et al. |
| 6,412,097 B1 | 6/2002 | Kikuchi et al. |
| 6,412,102 B1 | 6/2002 | Andreev et al. |
| 6,415,422 B1 | 7/2002 | Mehrotra et al. |
| 6,436,804 B1 | 8/2002 | Igarashi et al. |
| 6,442,743 B1 | 8/2002 | Sarrafzadeh et al. |
| 6,442,745 B1 | 8/2002 | Arunachalam et al. |
| 6,448,591 B1 | 9/2002 | Juengling |
| 6,463,575 B1 | 10/2002 | Takahashi |
| 6,473,891 B1 | 10/2002 | Shively |
| 6,480,991 B1 | 11/2002 | Cho et al. |
| 6,490,713 B1 | 12/2002 | Matsumoto |
| 6,505,331 B1 | 1/2003 | Bracha et al. |
| 6,516,455 B1 | 2/2003 | Teig et al. |
| 6,519,751 B1 | 2/2003 | Sriram et al. |
| 6,543,043 B1 | 4/2003 | Wang et al. |
| 6,546,540 B1 | 4/2003 | Igarashi et al. |
| 6,557,145 B1 | 4/2003 | Boyle et al. |
| 6,567,967 B1 | 5/2003 | Greidinger et al. |
| 6,601,227 B1 | 7/2003 | Trimberger |
| 6,618,849 B1 | 9/2003 | Teig et al. |
| 6,651,224 B1 * | 11/2003 | Sano et al. .................. 716/2 |
| 6,651,233 B1 | 11/2003 | Teig et al. |
| 6,671,864 B1 | 12/2003 | Teig et al. |
| 6,678,872 B1 | 1/2004 | Teig et al. |
| 6,687,893 B1 | 2/2004 | Teig et al. |
| 6,738,960 B1 | 5/2004 | Teig et al. |
| 6,745,379 B1 | 6/2004 | Teig et al. |
| 6,795,958 B1 | 9/2004 | Teig et al. |
| 6,802,049 B1 | 10/2004 | Teig et al. |
| 2001/0003843 A1 | 6/2001 | Scepanovic et al. |
| 2001/0009031 A1 | 7/2001 | Nitta et al. |
| 2002/0069397 A1 | 6/2002 | Teig et al. |
| 2002/0100007 A1 | 7/2002 | Teig et al. |
| 2002/0124231 A1 | 9/2002 | Teig et al. |
| 2002/0124235 A1 * | 9/2002 | Yamashita .................. 716/19 |
| 2002/0133798 A1 | 9/2002 | Teig et al. |
| 2002/0147958 A1 | 10/2002 | Teig et al. |
| 2002/0157075 A1 | 10/2002 | Teig et al. |
| 2002/0166105 A1 | 11/2002 | Teig et al. |
| 2002/0170027 A1 | 11/2002 | Teig et al. |
| 2002/0182844 A1 | 12/2002 | Igarashi et al. |
| 2002/0199165 A1 | 12/2002 | Teig et al. |
| 2003/0005399 A1 | 1/2003 | Igarashi et al. |
| 2003/0014725 A1 | 1/2003 | Sato et al. |
| 2003/0018947 A1 | 1/2003 | Teig et al. |
| 2003/0025205 A1 | 2/2003 | Shively |
| 2003/0043827 A1 | 3/2003 | Teig et al. |
| 2003/0046646 A1 * | 3/2003 | Amano et al. ............... 716/9 |
| 2003/0056187 A1 | 3/2003 | Teig et al. |
| 2003/0063568 A1 | 4/2003 | Teig et al. |
| 2003/0063614 A1 | 4/2003 | Teig et al. |
| 2003/0066042 A1 | 4/2003 | Teig et al. |
| 2003/0066043 A1 | 4/2003 | Teig et al. |
| 2003/0079193 A1 | 4/2003 | Teig et al. |
| 2003/0088841 A1 | 5/2003 | Teig et al. |
| 2003/0088844 A1 | 5/2003 | Teig et al. |
| 2003/0088845 A1 | 5/2003 | Teig et al. |
| 2003/0101428 A1 | 5/2003 | Teig et al. |
| 2003/0115566 A1 | 6/2003 | Teig |
| 2003/0217346 A1 | 11/2003 | Teig et al. |
| 2004/0044979 A1 * | 3/2004 | Aji et al. .................... 716/13 |
| 2004/0123260 A1 | 6/2004 | Teig et al. |

FOREIGN PATENT DOCUMENTS

| | | |
|---|---|---|
| JP | 02-262354 | 10/1990 |
| JP | 03-173471 | 7/1991 |
| JP | 05-102305 | 4/1993 |
| JP | 05-243379 | 9/1993 |
| JP | 07-86407 | 3/1995 |
| JP | 09-162279 | 6/1997 |
| JP | 11-296560 | 10/1999 |
| JP | 2000-82743 | 3/2000 |

OTHER PUBLICATIONS

U.S. Appl. No. 09/737,245, filed Dec. 13, 2000, Teig et al.

Ahuja, R. et al., Faster Algorithms for the Shortest Path Problem, Journal of the Association for Computing Machinery, vol. 37, No. 2, Apr. 1990, pp. 213-223.

Alexander et al., Performance-Oriented Placement and Routing for field-programmable gate arrays, Proceedings of the European Design Automation Conference, pp. 80-85, 1995.

Alexander et al., Placement and Routing for Performance-Oriented FPGA Layout, VLSI Design, vol. 7, No. 1, 1998.

Brady, L. et al., Channel Routing on a 60° Grid, extended abstract, pp. 956-931.

Brambilla, A. et al., Statistical Method for the Analysis of Interconnects Delay in Submicrometer Layouts, IEEE, Aug. 2001, pp. 957-966.

Carothers, K., A Method of Measuring Nets Routability for MCM's General Area Routing Problems, 1999, pp. 186-192.

Chen, H. et al., Physical Planning of On-Chip Interconnect Architectures, 2002, IEEE, International Conference, pp. 30-35.

Cheng, K. et al., Manhattan or Non Manhattan? A Study of Alternative VLSI Routing Architectures, pp. 47-52, 2000.

Cheng, K., Steiner Problem in Octilinear Routing Model, a Thesis Submitted for the Degree of Master of Science, National University Singapore, 1995, pp. 1-122.

Chiang, et al., Wirability of Knock-Knee Layouts with 45° Wires, IEEE Transactions on Circuits and Systems, vol. 38, Issue 6, pp. 613-624, Jun. 1991.

Chip Model with Wiring Cost Map, Aug. 1983, IBM Technical Disclosure Bulletin, vol. 26, iss. 3A, pp. 929-933.

Cong J. et al., DUNE—A Multilayer Gridless Routing System, May 2001, IEEE Transactions on Computer-Aided Design of Integrated Circuits and Systems, vol. 20, iss. 5, pp. 633-647.

Cong, J. et al., Efficient Heuristics for the Minimum Shortest Path Steiner Arborescence Problem with Applications to VLSI Physical Design, Cadence Design Systems and UCLA Computer Science Department, pp. 88-95.

Cong, J. et al., Performance-Driven Multi-Layer General Routing for PCB/MCM Designs, UCLA Computer Science Department, 1998, pp. 356-361.

Dood, et al. A Two-Dimensional Topological Compactor with Octagonal Geometry, 28th ACM/IEEE Design Automation Conference, pp. 727-731, Jul. 1991.

Dutt, et al., Probability-Based Approaches to VLSI Circuit Partitioning, IEEE Trans. on Computer-Aided Design of IC's and Systems, vol. 19, No. 5, May 2000, pp. 534-549.

Enbody, R. et al., Near-Optimal n-Layer Channel Routing, 23rd Design Automation Conference, 1986, pp. 708-714.

Fang, S. et al., Constrained Via Minimization with Practical Considerations for Multi-Layer VLSI/PCB Routing Problems, 28th ACM/IEEE Design Automation Conference, 1991, pp. 60-65.

Farrahi et al., Quality of EDA CAD Tools: Definitions, Metrics and Directions, Quality Electronic Design, 2000, Proceedings of the first International Symposium on Mar. 2000, pp. 395-405.

Hom, I. et al., Estimation of the Number of Routing Layers and Total Wirelength in a PCB Through Wiring Distribution Analysis, 1996, pp. 1-6.

Hong, X. et al., Performance-Driven Steiner Tree Algorithms for Global Routing, 30th ACM/IEEE Design Automation Conference, 1993, pp. 177-181.

Hu, J et al.: "A Timing-Constrained algorithm for Simultaneous Global Routing of Multiple Nets" IEEE/ACM International Conference on Computer Aided Design. ICCAD—2000. IEEE/ACM Digest of Technical Papers (CAT. No.00CH37140), Proceedings of International Conference on Computer Aided Design (ICCAD), San Jose, CA USA, Nov. 5-9, 2000. pp. 99-103.

Igarashi et al., A Diagonal-Interconnect Architecture and Its Application to RISC Core Design, 2002 IEEE Solid-State Circuits Conference, pp. 210-460, Feb. 2002.

Kastner, R et al.: "Predictable Routing" IEEE/ACM International Conference on Computer Aided Design. ICCAD—2000. IEEE/ACM Digest of Technical Papers (CAT. No.00CH37140), Proceedings of International Conference on Computer Aided Design (ICCAD), San Jose, CA, USA, Nov. 5-9, 2000. pp. 110-113.

Khoo, K. et al., An Efficient Multilayer MCM Router Based on Four-Via Routing, 30th ACM/IEEE Design Automation Conference, 1993, pp. 590-595.

Lillis, J. et al., Table-Lookup Methods for Improved Performance-Driven Routing, 1998, pp. 368-373.

Lipski, W. et al., A Unified Approach to Layout Wirability, Mathematical Systems Theory, 1987, pp. 189-203.

Lodi, E. et al., A Preliminary Study of a Diagonal Channel-Routing Model, Algorithmica, 1989, pp. 585-597.

Lodi, E. et al., Lecture Notes in Computer Science, A 4d Channel Router for a Two Layer Diagonal Model, pp. 464-476, Jul. 1988.

Naclerio, N. et al., Via Minimization for Gridless Layouts, 24th ACM/IEEE Design Automation Conference, 1987, pp. 159-165.

Nam, G. et al, Satisfiability-Based Layout Revisited: Detailed Routing of Complex FPGAs Via Search-Based Boolean SAT, 1999, pp. 167-175.

Oh, J. et al., Constructing Lower and Upper Bounded Delay Routing Trees Using Linear Programming, 33rd Design Automation Conference, 1996.

Parakh et al., Congestion Driven Quadratic Placement, Proceedings of Design Automation Conference, 1998, pp. 275-278.

Partitioning Logic on to Graph Structure, IBM Technical Disclosure Bulletin, Feb. 1990, vol. 32, iss. 9A, pp. 469-475.

Phillips N., Channel Routing by Constraint Logic, Department of Computer Science Southern Illinois University, ACM, 1992.

Powers et al., The 60° Grid: Routing Channels in Width d/square root 3, VLSI, 1991, Proceedings., First Great Lakes Symposium on Kalamazoo, MI, USA, pp. 214-291, Mar. 1991.

Putatunda et al., VITAL: Fully Automatic Placement Strategies for Very Large Semicustom Designs, Proceedings of the International Conference on Computer Design: VLSI in Computers and Processors, pp. 434-439 Oct. 1988.

Sekiyama et al., Timing-Oriented Routers for PCB Layout Design of High-Performance Computers, International Conference on Computer Aided Design, pp. 332-335, Nov. 1991.

Su et al., Post-Route Optimization for Improved Yield Using Rubber-Band Wiring Model, 1997 International Conference on Computer-Aided Design, pp. 700-706, Nov. 1997.

Takashima, Y. et al, Routability of FPGAs with Extremal Switch-Block Structures, IEICE Trans. Fundamentals, vol. E81-A, No. 5, May 1998, pp. 850-856.

Thakur, S. et al., Algorithms for a Switch Module Routing Problem, 1994, pp. 265-270.

Theune, D., et al., HERO: Hierarchical EMC-constrained routing, Nov. 1992, IEEE pp. 468-472.

Tseng, H., Timing and Crosstalk Driven Area Routing, pp. 378-381.

Vicente, RSR: A New Rectilinear Steiner Minimum Tree Approximation for FPGA Placement and Global Routing, Proceedings of the 24th Euro Micro Conference, pp. 192-195, Aug. 1998.

Wang, D., Novel Routing Schemes for IC Layout, Part I: Two-Layer Channel Routing, 28th ACM/IEEE Automation Conference, 1991, pp. 49-53.

Wang, M. et al., Modeling and Minimization of Routing Congestion, Jan. 2000, IEEE proceedings of ASP-DAC, Asia and South Pacific, pp. 185-190.

Wood, G. et al., FPGA Routing and Routability Estimation Via Boolean Satisfiability, Department of Electrical and Computer Engineering Carnegie Mellon University, Pittsburgh, PA, pp. 119-125.

Zhang, C.X. et al., Floorplan Design Using a Hierarchical Neutral Learning Algorithm, IEEE, Jun. 1991. pp. 2060-2063.

Zhou, H. et al., An Optimal Algorithm for River Routing with Crosstalk Constraints, 1996.

Zhou, H. et al., Optimal River Routing with Crosstalk Constraints, ACM Transactions on Design Automation of Electronic Systems, vol. 3, No. 3, Jul. 1998, pp. 496-514.

Zhou, H. et al., Global Routing with Crosstalk Constraints, Department of Computer Sciences, University of Texas, 1998, pp. 374-377.

* cited by examiner

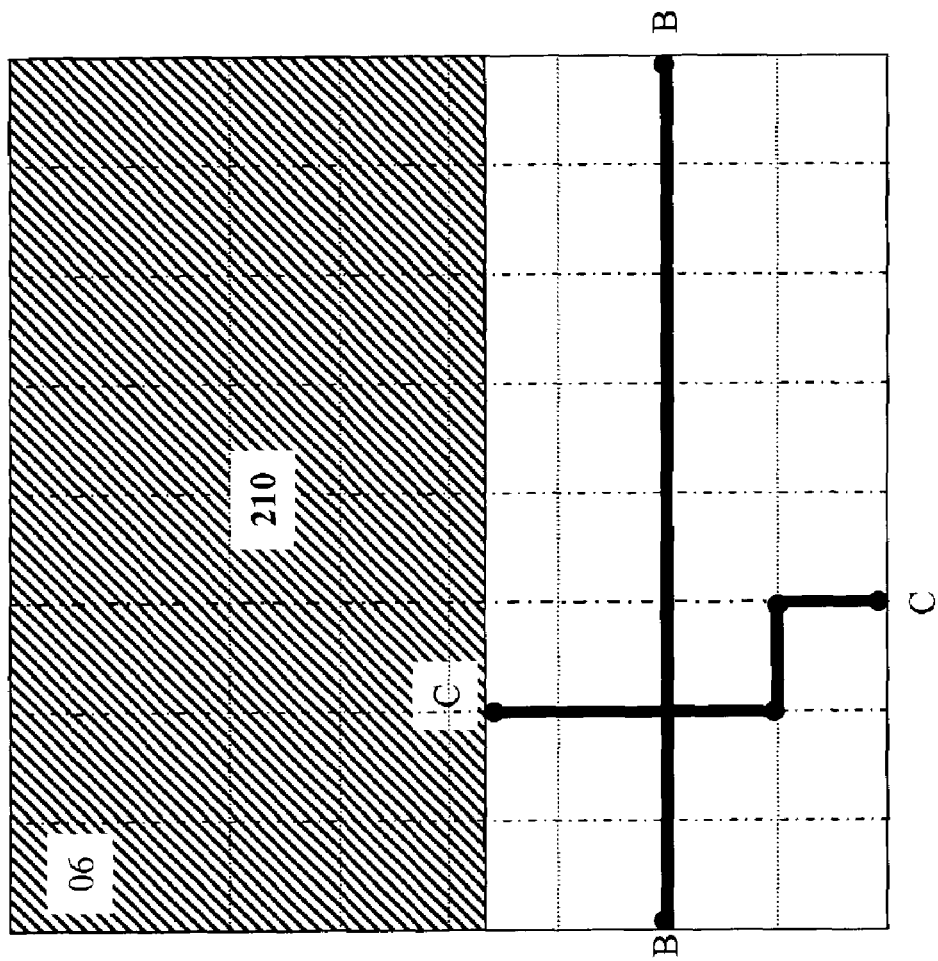

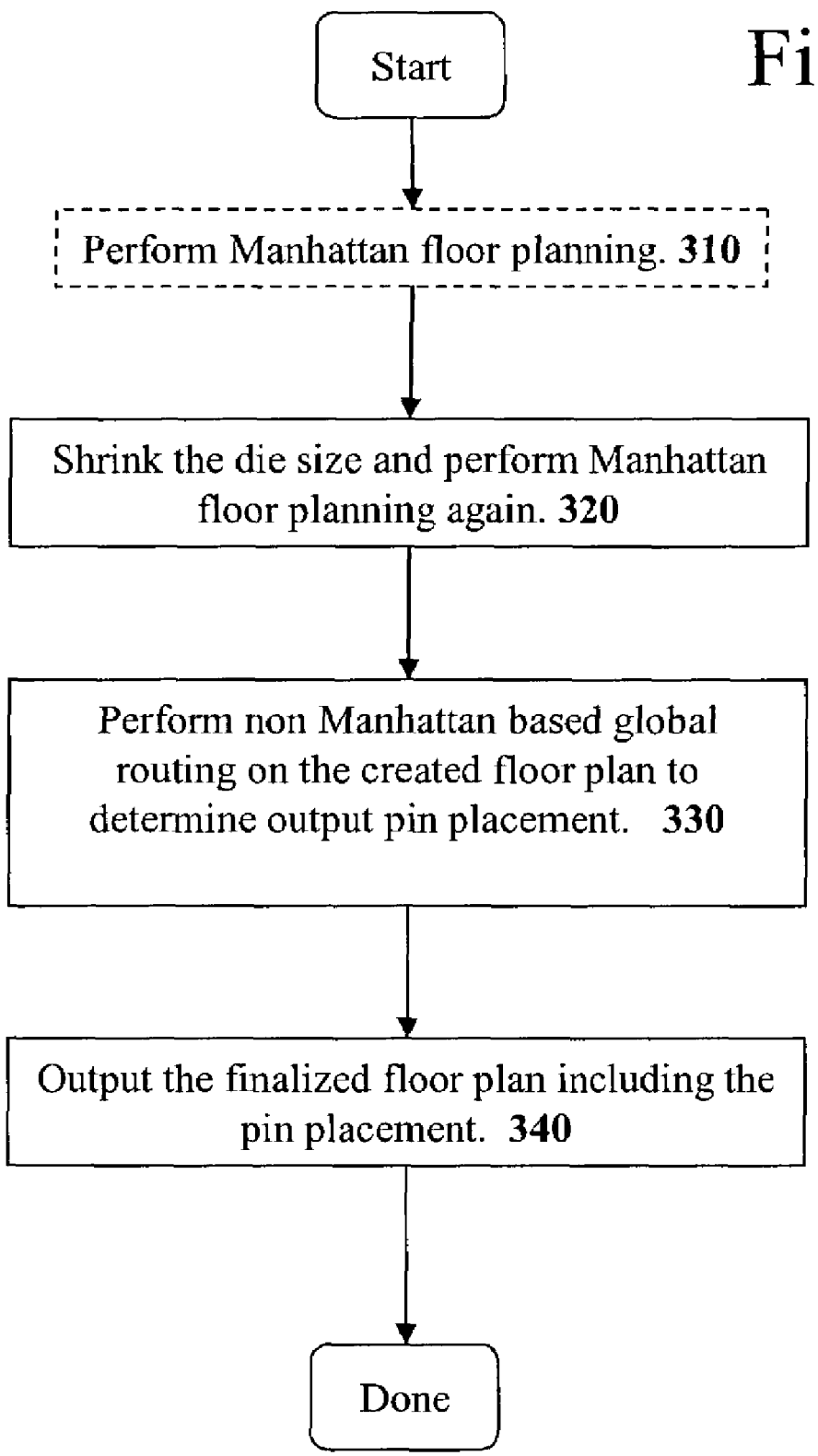

810

Wire_Cost = ΔX + ΔY + Via_cost

Wire_Cost = ($\sqrt{2}$*ΔY) + (ΔX-ΔY) + Via_cost

METHOD AND SYSTEM FOR PERFORMING PLACEMENT ON NON MANHATTAN SEMICONDUCTOR INTEGRATED CIRCUITS

FIELD OF THE INVENTION

The present invention relates to the field of semiconductor design and manufacture. In particular the present invention discloses methods and systems for floor planning circuit blocks and placing individual circuit cells on a non Manhattan semiconductor integrated circuit.

BACKGROUND OF THE INVENTION

An integrated circuit ("IC") is a semiconductor device that includes many electronic components (e.g., transistors, diodes, inverters, etc.). These electrical components are interconnected to form larger scale circuit components (e.g., gates, cells, memory units, arithmetic units, controllers, decoders, etc.) on the IC. The electronic and circuit components of IC's are jointly referred to below as "components." An integrated circuit also includes multiple layers of metal and/or polysilicon wiring that interconnect its electronic and circuit components.

Design engineers create an integrated circuit by transforming a circuit description of the integrated circuit into a geometric description called a 'layout'. To create an integrated circuit layout, design engineers typically use electronic design automation ("EDA") applications. These EDA applications provide sets of computer-based tools for creating, editing, and analyzing IC design layouts. EDA applications create layouts by using geometric shapes that represent different materials and devices on integrated circuits. For instance, EDA tools commonly use rectangular lines to represent the wire segments that interconnect the various IC components. These EDA tools also represent electronic and circuit IC components as geometric objects with varying shapes and sizes. For the sake of simplifying the discussion, these geometric objects are shown as rectangular blocks in this document. Also, in this document, the geometric representation of an electronic or circuit IC component by an EDA application is referred to as a "circuit module."

EDA applications typically illustrate circuit modules with electrical interface "pins" on the sides of the circuit modules. These pins connect to the interconnect lines, the "wiring" used to connect the various circuit modules in the integrated circuit. A collection of pins that are, or need to be, electrically connected is referred to as a "net".

Many integrated circuits are currently fabricated with five metal layers for interconnecting circuit modules. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction in an attempt to maximize the number of signal wires that may be placed on each wiring layer by preventing intersections. In current integrated circuits, the preferred direction alternates between successive metal layers. Most integrated circuits use a "Manhattan" wiring model, which specifies alternating layers of preferred-direction horizontal and vertical wiring. (Viewed from above, the horizontal and vertical interconnect wires of the integrated circuit resemble the orthogonal streets of Manhattan.) In the Manhattan wiring model, essentially all of the interconnect wires are horizontal or vertical.

The Manhattan wiring model has proven to be useful, but it is certainly not optimal. Diagonally separated distant pins must often be connected by long stretches of connected horizontal and vertical interconnect signals. To provide a more optimal system, a related patent application title "Multi-Directional Wiring On A Single Metal Layer", filed on Dec. 12, 2000 and having Ser. No. 09/733,104, incorporated by reference, uses a non Manhattan wiring model that uses diagonal direction wiring as a "preferred" direction for some of the wiring layers. Using diagonal wiring allows two diagonally separated pins to be connected with a shorter diagonal wire. For purposes of nomenclature, a "preferred" direction is defined as the direction that at least 40 percent of the wires are configured. Interconnect lines are considered "diagonal" if they form an angle other than zero or ninety degrees with respect to the layout boundary of the integrated circuit.

Although the introduction of the non Manhattan wiring architecture allows integrated circuits to be wired with greater efficiency, the non Manhattan wiring architecture requires a whole new set of electronic design automation ("EDA") applications. Existing EDA applications have been created with the premise that all interconnect wiring will be horizontal or vertical. Thus, a new set of EDA applications that have been designed with the premise of diagonal wiring are needed to take advantage of the inherent efficiencies of diagonally wired integrated circuits.

SUMMARY OF THE INVENTION

The present invention introduces methods of creating floor plans and placements for non Manhattan integrated circuits with existing electronic design automation tools. To create a floor plan, an existing Manhattan based floor planning tool is used. The die size for the floor plan is reduced to take into account the improved wiring density of non Manhattan wiring. A non Manhattan global router is then used on the floor plan to create pin placements. The floor plan may create a floor plan having circuit modules with beveled corners to take advantage of diagonal wiring. To create a placement, an existing Manhattan based placer is first used to create an initial placement. The initial placement is then processed by a non Manhattan aware post processor. The post processor performs local optimizations on the initial placement to improve the placement for a non Manhattan routed integrated circuit.

Other objects, features, and advantages of present invention will be apparent from the company drawings and from the following detailed description.

BRIEF DESCRIPTION OF THE DRAWINGS

The objects, features, and advantages of the present invention will be apparent to one skilled in the art, in view of the following detailed description in which:

FIG. 2b illustrates one possible global routing for the example integrated circuit of FIG. 2a.

FIG. 2c illustrates one possible detailed route for global routing area 06 of the example integrated circuit of FIG. 2b.

FIG. 3 illustrates a flow diagram that describes a first method of using a Manhattan based floor planner for non Manhattan floor planning.

FIG. 5b illustrates a non Manhattan floor plan for the integrated circuit of FIG. 5a.

FIG. 10b graphically illustrates a non Manhattan wiring length cost function between the same two ports of FIG. 10a.

DETAILED DESCRIPTION OF THE PREFERRED EMBODIMENT

Figure 1:
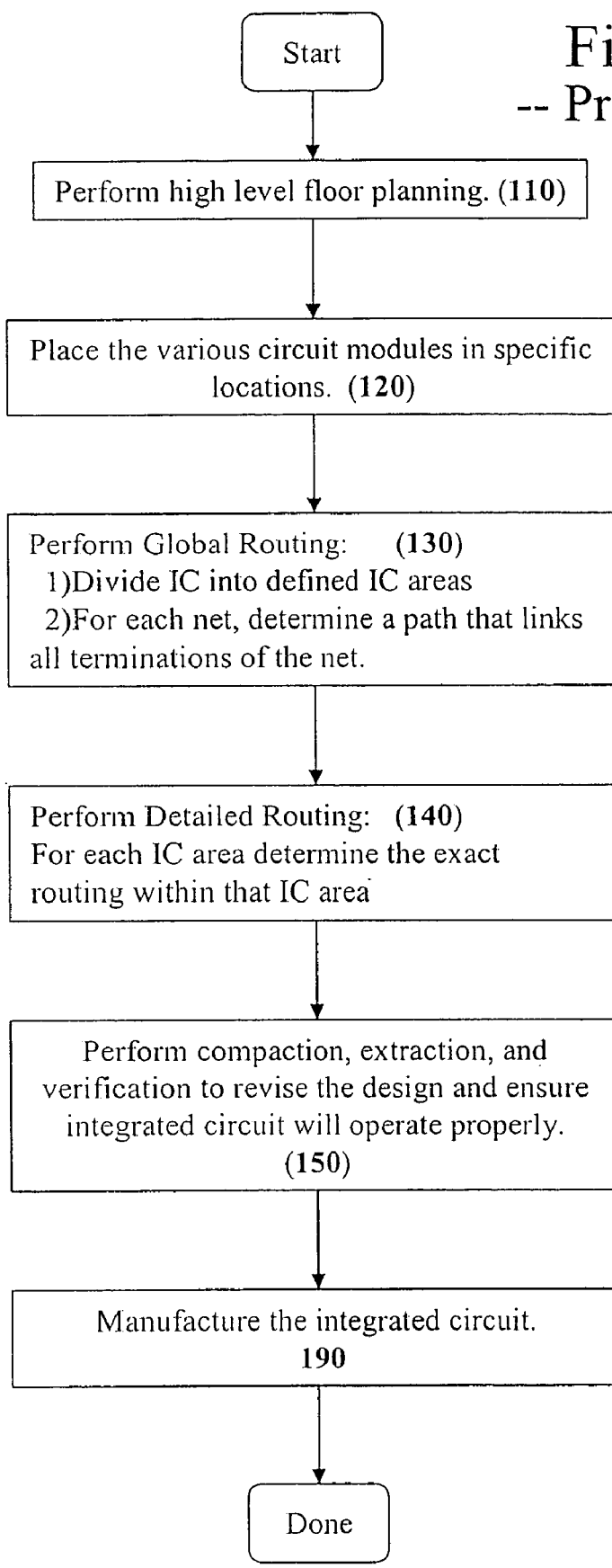
FIG. 1 illustrates a flow diagram describing the steps performed when laying out an integrated circuit design.

Methods and systems for floor planning circuit blocks and placing individual circuit cells on non Manhattan semiconductor integrated circuits are disclosed. In the following description, for purposes of explanation, specific nomenclature is set forth to provide a thorough understanding of the present invention. However, it will be apparent to one skilled in the art that these specific details are not required in order to practice the present invention. For example, the present invention discloses a placement post-processor that only considers local optimizations. However, other types of post-processors may be used.

Routing Architectures

Most existing semiconductors use the "Manhattan" wiring model that specifies alternating layers of preferred-direction horizontal and vertical wiring. In the Manhattan wiring model, the majority of the interconnect signals are horizontal or vertical. However, occasional diagonal jogs are sometimes allowed on the preferred horizontal and vertical layers.

The Manhattan wiring model has proven to be useful, but it is certainly not optimal. Distant pins must often be connected by long stretches of connected horizontal and vertical interconnect signals. To provide a more optimal system, U.S. Pat. No. 6,858,928, entitled "Multi-Directional Wiring On A Single Metal Layer", incorporated by reference, uses a non Manhattan wiring model that uses diagonal wiring as a "preferred" direction for some layers. With a non Manhattan architecture, diagonally separated pins can be coupled with a shorter wiring.

In one embodiment of a non Manhattan architecture, the diagonal wiring consists of wires deposed at plus 45 degrees or minus 45 degrees (referred to herein as "octalinear"). This architecture is referred to as octalinear wiring in order to convey that an interconnect line can traverse in eight separate directions from any given point.

In general, metal layers on integrated circuit are typically organized in perpendicular metal layer pairs. The use of perpendicular metal layer pairs minimizes wiring distances by minimizing the number of layers a wire or via must transverse to get to a layer with wires disposed in an orthogonal direction. In addition, the use of perpendicular wiring in adjacent layers eliminates wires routed in parallel on adjacent layers, thus reducing electrical coupling between metal layers and minimizes noise interference.

Some embodiments of the present invention are described using "complementary" pairs of wiring layers. As used herein, complementary pairs refer to two wiring layers with a preferred wiring direction perpendicular to one another or close to perpendicular to each other. For example, a complementary layer to a vertical wiring layer is a horizontal wiring layer. In diagonal wiring, a complementary direction to a plus 45 degree wiring direction is a negative 45 degree wiring direction.

The use of diagonal wiring more efficiently routes wires in an integrated circuit by reducing the length of the required interconnect wires. Many different combinations of wiring layers may be used. However, it has been found convenient to use Manhattan geometries for the first two metal layers (layers one and two) for compatibility reasons. Specifically, the use of horizontal and vertical preferred directions for layers one and two is desirable since many existing circuit libraries are designed for integrated circuits that will have horizontal and vertical preferred wiring for layers one and two. Many different types of metal layers may be placed on top of the first two Manhattan metal layers. In one embodiment, the next two layers are plus 45 degree wiring and negative 45 degree wiring. The use of horizontal and vertical preferred directions for the first three layers is desirable in some circumstances since some complex circuit libraries are designed for integrated circuits that have three Manhattan layers. The first three layers may be horizontal, vertical, horizontal (HVH); or vertical, horizontal, vertical (VHV).

To fully take advantage of the efficiencies of the non Manhattan architecture, the electronic design automation ("EDA") applications for designing, editing, and analyzing integrated circuits must take into consideration the wire length savings for diagonal interconnect lines for diagonally separated pins, diagonal wiring congestion, and other factors related to diagonal wiring. However, the creation of EDA applications is a difficult task. Since the existing EDA tools have built and refined over a period of many years, it would be desirable to adapt the existing EDA tools for use with integrated circuits having non Manhattan wiring architectures

EDA Tools for Integrated Circuit Design

The integrated circuit design process entails a series of operations. FIG. 1 illustrates the overall process for laying out and testing an integrated circuit device once the logical circuit design of the integrated circuit device has been completed. Some of the physical-design operations that electronic design automation ("EDA") applications commonly perform to help layout an integrated circuit include:

(1) floor planning (in step 110 of FIG. 1), which divides the overall integrated circuit layout area into different sections devoted to different purposes (such as ALU, memory, decoding, etc.);

(2) circuit placement (in step 120 of FIG. 1), which finds the alignment and relative orientation of the individual circuit modules;

(3) global and detailed routing (in steps 130 and 140 of FIG. 1), which completes the interconnects between the circuit modules as specified by the net list;

(4) compaction (in step 150 of FIG. 1), which compresses the layout in all directions to decrease the total IC area; and (5) verification (in step 150 of FIG. 1), which checks the layout to ensure that it meets design and functional requirements.

Referring to step 110 of FIG. 1, integrated circuit layout designers initially perform high-level floor planning. During the high-level floor planning, layout designers decide roughly where various large circuit blocks will be placed on the integrated circuit. Generally, a floor planning application is used to help the designer determine an optimized floor plan for the integrated circuit. The floor planning application examines such factors as interconnect wire density and interconnect wire lengths.

Figure 2A:
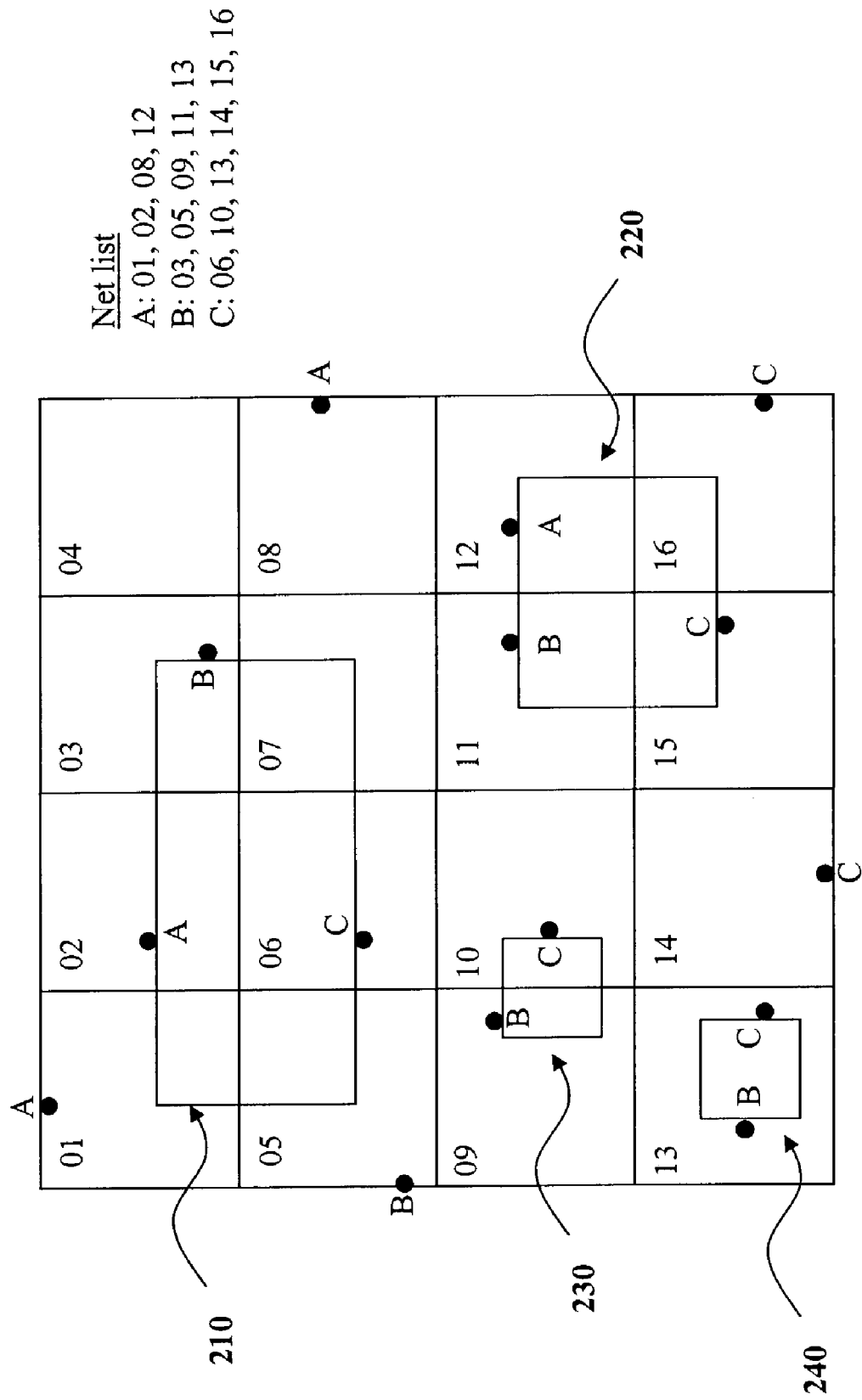
FIG. 2a illustrates an example of circuit placement for an integrated circuit layout along with nets for common electrical signals.

After high-level floor planning, the layout designers then perform a "placement" step 120. During the placement step, the layout designers place all the individual circuit cells into specific locations while following the high-level floor planning map created in step 110. The circuit placement step 120 is largely performed with the help of an EDA placement tool that helps select optimized placement of each circuit cell. FIG. 2a illustrates an example of two large circuit modules 210 and 220 and two smaller circuit modules 230 and 240 placed onto an integrated circuit layout. The various circuit modules may be rotated ninety degrees as necessary to obtain a desired layout.

After circuit placement, routing is performed to link together the various circuits with interconnect wiring. The routing task is generally divided into two sub steps: (1) global routing (step 130 of FIG. 1) and (2) detailed routing (step 140 of FIG. 1). Global routing divides an integrated circuit into individual global routing areas. Then, a global routing path is created for each net by listing the global routing areas that the net must pass through. After global wiring routes have been created, each individual global routing area is then processed with detailed routing. Detailed routing creates specific individual routing paths for each net within that global routing area.

Global routing is a step that is used to divide an extremely difficult overall integrated circuit routing problem into smaller routing problems in a "divide and conquer" problem-solving approach. The overall task of routing an integrated circuit is to route together all electrically common signals on the integrated circuit. (In dense integrated circuit, this problem may including millions of individual interconnect wires.) The global routing step divides an integrated circuit area into individual global routing areas and then determines the specific global routing areas that each electrically common signal must pass through. The list of circuit modules and pins that need to be connected for a specific electrically common signal is known as a net. The contiguous path through the global routing areas that couples all the pins in a net is known as a "global routing path" for that net. A simple example of global routing is provided with reference to FIGS. 2a and 2b.

Referring to simplified example of FIG. 2a, there are three different electrically common signals that are designated as A, B, and C. The electrical signal terminations for electrically common signals A, B, and C are illustrated on FIG. 2a as marked dots. The electrical signal terminations are commonly referred to as "pins". Furthermore, the integrated circuit of FIG. 2a has been divided into sixteen different square global routing areas that are labeled 01 to 16 in the upper left-hand corner of each global routing area. For each electrically common signal, a net is created containing a list of all the global routing areas that have common electrical signal termination pins. Thus, for example, the net of electrical signal A is 01, 02, 08, and 12 since electrical signal A has termination pins in those labeled global routing areas.

Figure 2B:
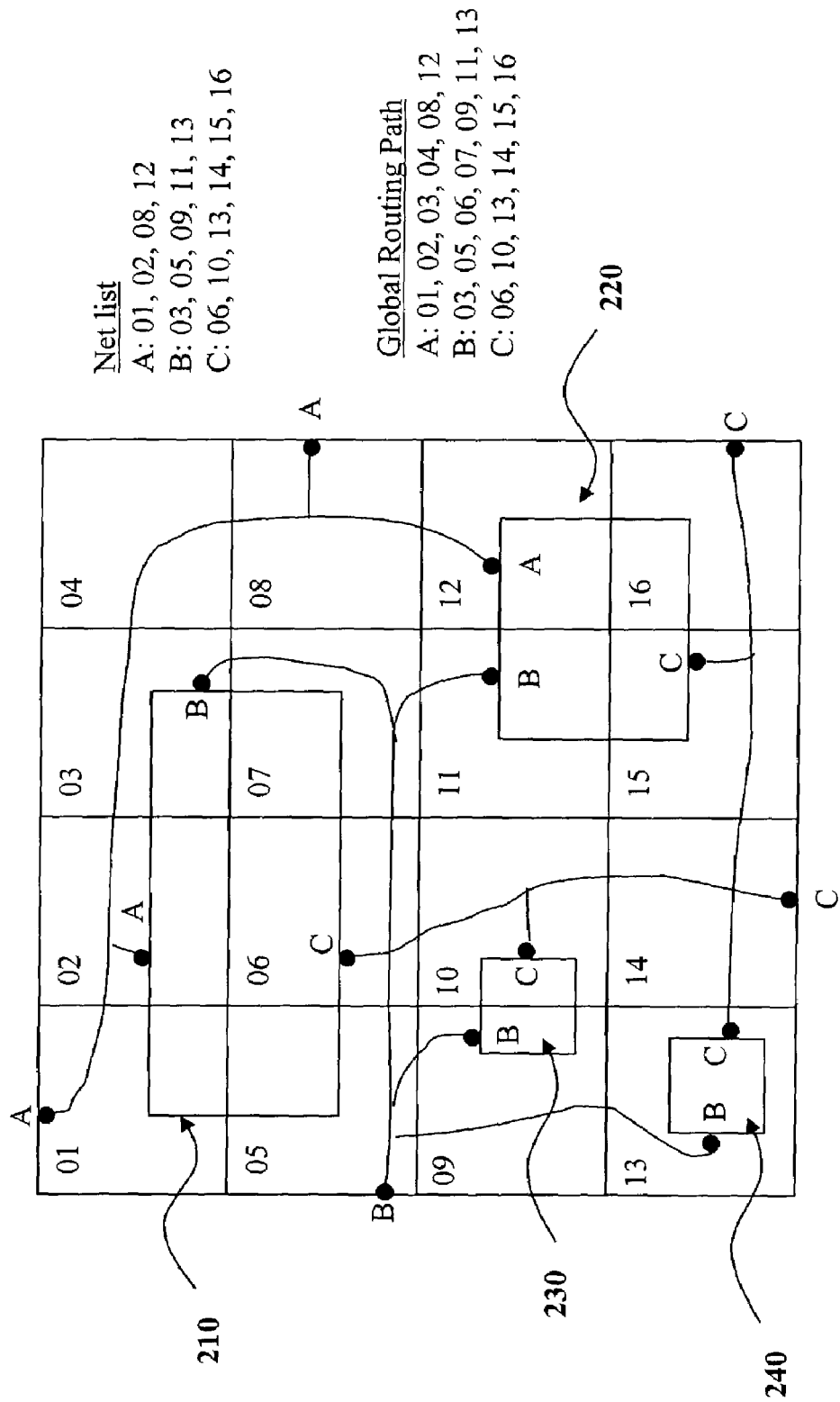

After determining the various nets, a global routing application is then used to determine global routing path lists for all the different nets. FIG. 2b illustrates the integrated circuit of FIG. 2a with the addition of global routing path lists and roughly sketched global routing paths. (The actual specific routing path is not determined during the global routing step, just the list of global routing areas that a signal must enter or pass through.) The global routing paths join together the global routing areas in the nets with additional global routing areas such that all global routing areas in the global routing path list form a contiguous global routing path. Note that each individual net may have many different possible global routing paths. The global routing application program attempts to select the global routing paths that are close to optimal. Again, the metrics examined include overall interconnect wiring length and interconnect wiring density.

Referring back to the flow diagram for integrated circuit layout in FIG. 1, detailed routing is performed next, at step 140, for the various global routing areas. During the detailed routing stage, a router application assigns a specific route in a specific global routing area for each electrical interconnect signal line that passes through or terminates within a particular global routing area. Generally, detailed routing systems use a routing grid that specifies a very limited set of possible locations for the various electrical interconnect signals. Adjacent electrical interconnect signals in a gridded detailed routing system are separated by a worst-case distance that will ensure that adjacent electrical interconnect signals are not shorted together during the manufacturing process. Other detailed routing applications are 'gridless' such that there is no limitation on where an interconnect wire may be placed.

Figure 2D:
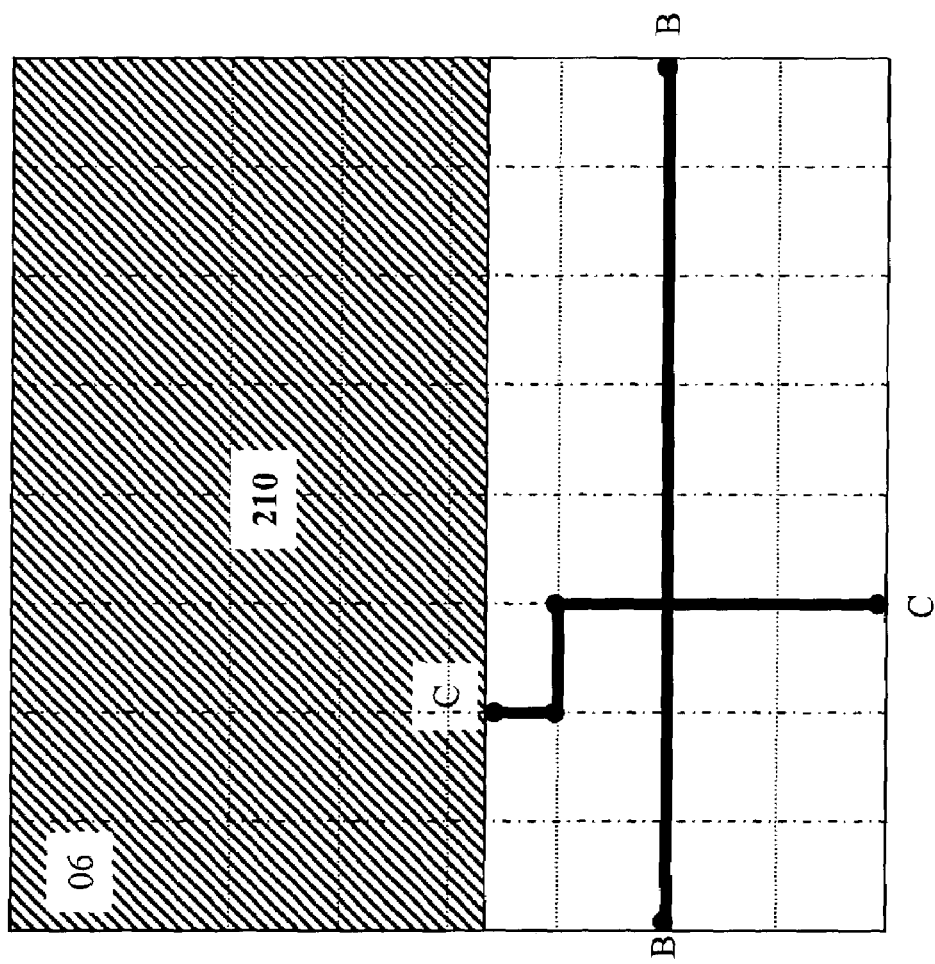
FIG. 2d illustrates one possible detailed route for global routing area 06 of the example integrated circuit of FIG. 2b.

The routing example illustrated in FIGS. 2a and 2b requires several detailed routing to be performed in all the global routing areas that contain interconnect wiring. For example, the detailed routing for global routing area 06 requires that electrical interconnect signal B pass from the left side to the right side of the global routing area and electrical interconnect signal C enter from the bottom and terminate at a pin on large circuit module 210. FIG. 2c illustrates an example of one possible detailed route for global routing area 06. Note that the detailed electrical interconnect signal routes illustrated in FIG. 2c follow a prescribed routing grid that is illustrated with dashed lines. The vertical and horizontal interconnect lines are on different layers such that there is no electrical connection at places where the interconnect wires cross unless a via has been created at that location. In most cases, many different possible detailed routing paths exist. For example, FIG. 2d illustrates just one alternate detailed electrical interconnect signal routing for global routing area 06 of the layout illustrated in FIGS. 2a and 2b.

Since the global routing step 130 divided the overall routing problem into many smaller routing problems, the detailed routing of each individual global routing area is simplified. If a particular detailed routing problem is unsolvable, the system may return to step 130 in order to obtain a different global routing solution and then attempt detailed routing on the new global routing solution. Thus, routing an integrated circuit is often an iterative process.

Referring back to FIG. 1, after the routing steps have been performed, the integrated circuit layout is tested and optimized at step 150. Common testing and optimization steps include extraction, verification, and compaction. The steps of extraction and verification are performed to ensure that the integrated circuit layout will perform as desired. Compaction allows designers to reduce the size of an integrated circuit design in order to improve performance. Furthermore, a compacted design lowers costs by allowing more integrated circuits to be produced for a given wafer size. Finally, the final tested and optimized integrated circuit design is manufactured at step 190. Note that problems may occur during various steps of the integrated circuit layout forcing the designers to return to earlier steps.

The introduction of non Manhattan architecture primarily impacts the routing stages of the integrated circuit design. Specifically, the ability to couple circuit modules with diagonal interconnect wires allows the router to more efficiently couple circuit modules with shorter interconnect wires. With shorter interconnect wires, the integrated circuit can be made smaller (and thus faster).

However, other integrated circuit design stages are not as heavily impacted. Thus, it would be desirable to adapt the existing EDA applications to handle non Manhattan architectures. The present invention introduces methods of adapting existing Manhattan based EDA applications for use with non Manhattan integrated circuits.

Non Manhattan Floor Planning with a Manhattan Floor Planner

Many years of development experience are embodied in the current Floor Planning applications designed for Manhattan based integrated circuits. Although these existing Manhattan-based floor planning applications have not been optimized for non Manhattan integrated circuits, it has been found that these Manhattan-based floor planning applications provide good floor plans that may be used for non Manhattan integrated circuits. Thus, with a few modifications, an existing Manhattan-based floor planning application may be used to provide plans for non Manhattan integrated circuits.

FIG. 3 illustrates a flow diagram that describes the overall system of creating a floor planning system for non Manhattan architectures based upon an existing Manhattan based floor planning system. Initially, at step 310, the system creates an initial floor plan with a Manhattan based floor planning tool. The initial floor plan created at step 310 will determine the die size needed to implement the integrated circuit design if the integrated circuit were going to be routed with Manhattan routing. In another embodiment, the system uses a different method to determine the die size of a Manhattan floor plan and thus does not need to perform step 310.

Next, at step 320, the size of the integrated circuit die is reduced and the Manhattan floor planning system is executed again. The die size may be reduced since the non Manhattan design will be able reduce the amount of wire used to route the design such that less area will be required. With a good floor plan and placement, non Manhattan wiring should save around 15% of die area such that the die may be shrunk 15%. The amount that the die is reduced by may vary. In one embodiment, the die is reduced by 13%.

When the Manhattan floor planner is executed with the reduced die size, the Manhattan floor planner will generate a floor plan that has too much congestion to be routed properly if Manhattan routing were used. However, since Manhattan based routing will not be used, the congestion errors may be ignored. At the end of step 320 a rough floor plan has been created.

The rough floor plan from step 320 has been created by a Manhattan based floor planning tool such that it is not appropriate for use in a non Manhattan based system. In order to adapt the Manhattan based floor plan, the system of the present invention invokes a non Manhattan based global router on the Manhattan based floor plan at step 330. The non Manhattan based global router will route all the interconnect signals between the various circuit blocks. The system then places output pin locations at the locations where the interconnect signals exit the circuit blocks.

After adding the pin locations at step 340, the system outputs a finalized floor plan for the non Manhattan based integrated circuit at step 340. After the floor planning of FIG. 3, the next step for creating the integrated circuit is a placement of circuit modules.

Alternate Floor Planning System

Figure 4:
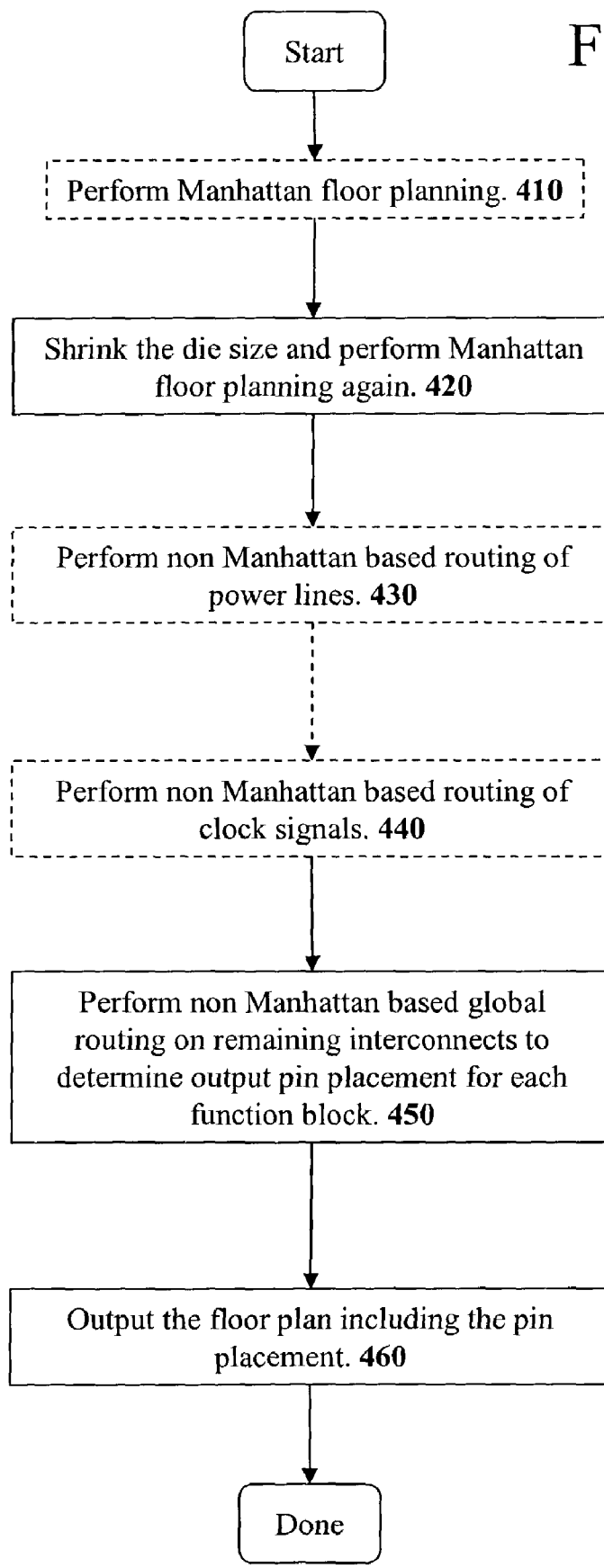
FIG. 4 illustrates a flow diagram that describes a second method of using a Manhattan based floor planner for non Manhattan floor planning.

FIG. 4 illustrates a flow diagram that describes an alternate floor planning system for non Manhattan architectures based upon an existing Manhattan based floor planning system. Initially, at steps 410 and 420, the system creates an initial floor plan with a Manhattan based floor planning tool as previously set forth with reference to FIG. 3 wherein the die size is smaller than would be used for a Manhattan based integrated circuit.

Next, at step 430, the integrated circuit designer performs non Manhattan routing of power lines. Power lines are often treated differently than other interconnect lines since power lines may carry more current and must be routed to all the different circuit modules. Then, at step 440, the integrated circuit designer performs non Manhattan routing of clock lines. Clock line routing is very specialized since the clock lines must be routed in a manner that minimizes clock skew between different circuit blocks that communicate with each other. The power line and clock signal routing may be performed with special routing tools that consider non Manhattan efficiencies. After the power line and clock signal routing steps of 430 and 440, the system places output pins for the power and clock signals at the locations where the power and clock signals exit the circuit blocks.

To complete the adaptation of the Manhattan based floor plan for a non Manhattan integrated circuit, the system of the present invention invokes a non Manhattan based global router on the Manhattan based floor plan at step 450 to route the remaining signals. The non Manhattan based global router will route interconnect wires between the various circuit blocks for the remaining signals. Again, the system then places output pin locations at the locations where the interconnect signals exit the circuit blocks. Then at step 460, the system outputs the floor plan for the non Manhattan integrated circuit.

Floor Planning Shapes

As set forth in the preceding sections, a non Manhattan global router can be used to determine the pin placements on a floor plan from Manhattan based floor planner. The non Manhattan based global router will likely specify a number of interconnect wires that will exit or enter a circuit module at a diagonal angle. Since it is most efficient to have wires leave at a perpendicular angle, it would be desirable to change the shape of some circuit modules. This may be performed by beveling the corners of rectangular circuit modules.

Figure 5A:
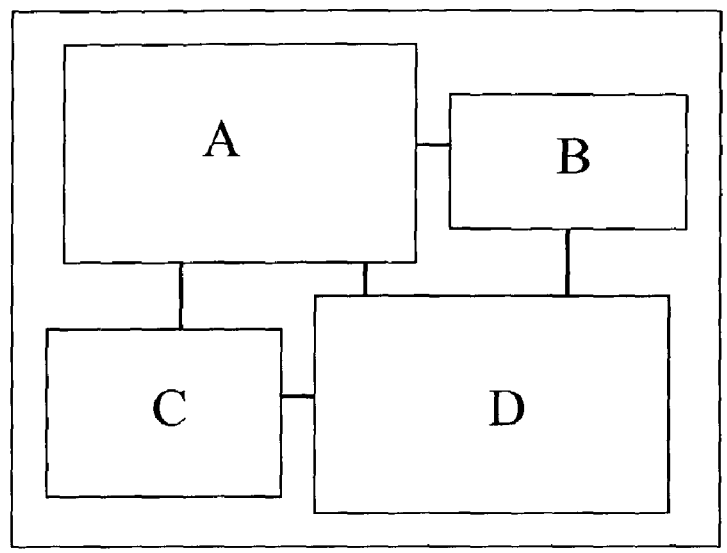
FIG. 5a illustrates an example of a Manhattan based floor plan for an integrated circuit.
Figure 5B:
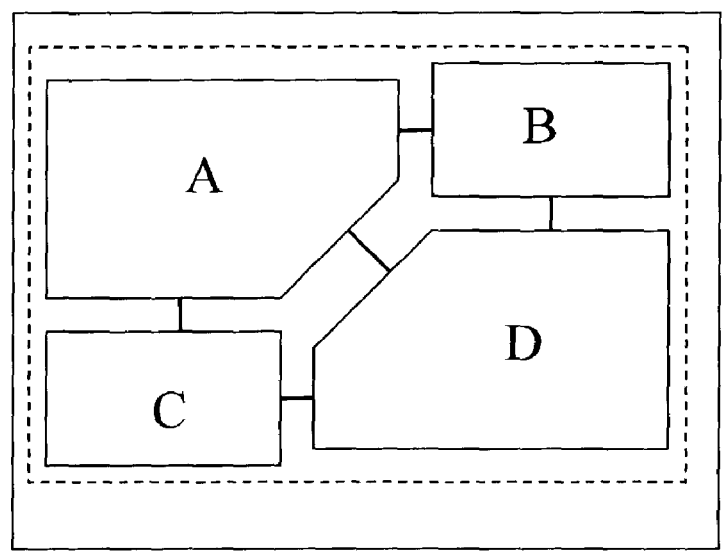

If a large number of diagonal wires couple nearby circuit blocks, then the adjacent beveled edges of the circuit blocks may allow the two circuit blocks to be moved closer together. For example, FIG. 5a illustrates a floor plan for a Manhattan routed integrated circuit containing circuit blocks A, B, C, and D. The illustrated floor plan was created since the main connections are illustrated. (A connects to B, C, & D; and D connects with B, C, and A.). With non Manhattan routing, diagonal wiring can be used to couple circuit block A and circuit block D. By creating a beveled edge on the proximate corners of circuit block A and circuit block D, those two circuit blocks can be moved closer together as illustrated in FIG. 5b.

Non Manhattan Placement with a Manhattan Based Placer

Referring back to FIG. 1, after the high level floor placement has been performed in step 110, the next step to be performed is placement of the individual circuit modules at step 120. Ideally, a placement application (sometimes referred to as a 'placer') places the individual circuit modules in a manner that minimizes the total length of interconnect wiring and limits congestion. As with floor planning, it has been found that with some modifications, existing Manhattan based placers can be used to help perform placement for non Manhattan integrated circuits.

Figure 6:
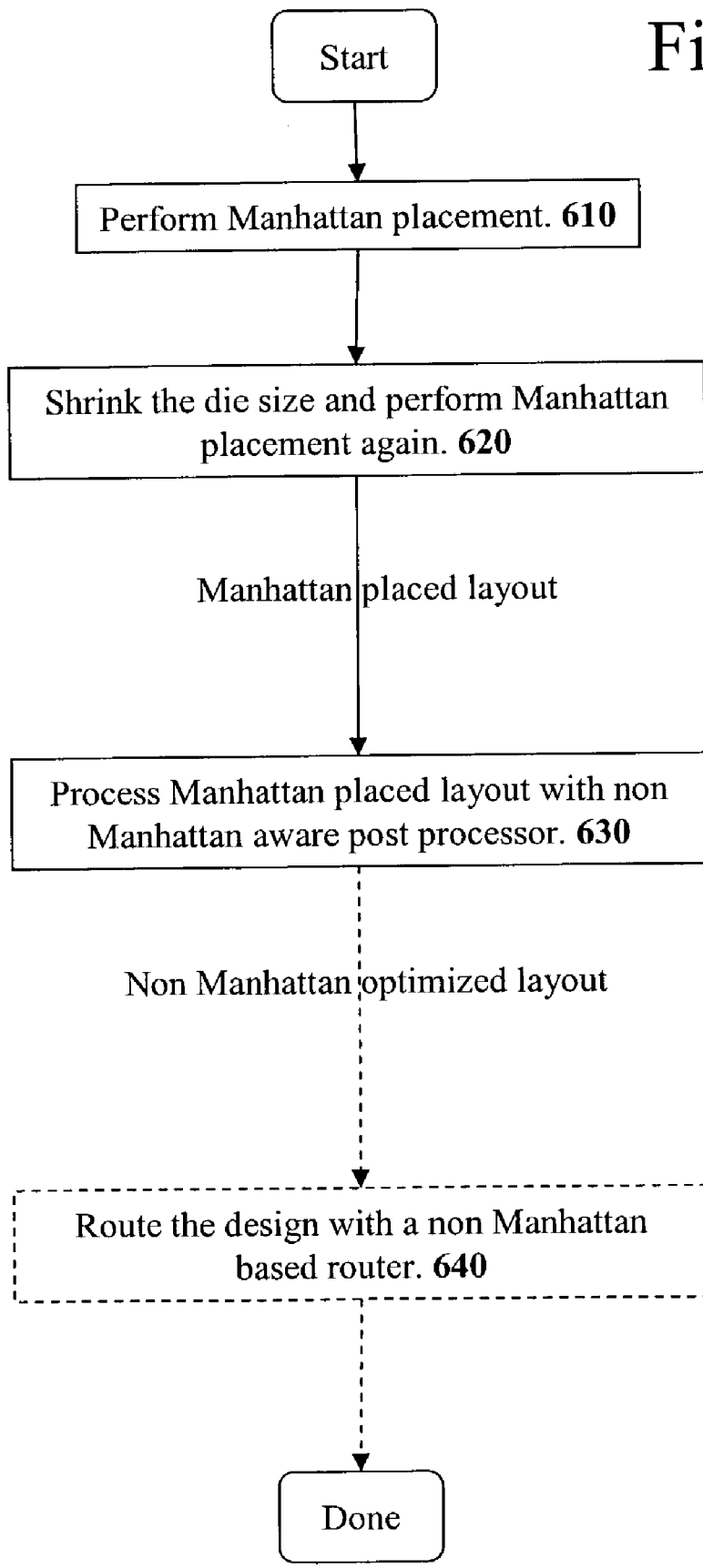
FIG. 6 illustrates a flow diagram that describes a first method of using a Manhattan based placer for placing circuit modules on a non Manhattan based integrated circuit.

FIG. 6 illustrates a flow diagram that describes how a Manhattan based placer can be used to perform placement for a non Manhattan integrated circuit. Initially, at step 610, the Manhattan based placer is executed to created an initial placement at step 610. The die size is then reduced to account for the savings that will be achieved when non Manhattan routing is performed and the Manhattan placer is run again at step 620. The result after step 620 is a placement that has been created for a Manhattan based router to route.

A non Manhattan based router could route this placement result after step 620, but additional improves can be achieved. Thus, a non Manhattan architecture aware post processor is used to further refine the placement received from the Manhattan based placer at step 630. The non Manhattan post processor takes into consideration the standard placement metrics (such as overall interconnect wiring length, timing, congestion, etc.) but considers those metrics in view of the ability to use diagonal interconnect wires. If the non Manhattan post processor can determine improvements that can be made by adjusting the placement and using diagonal wiring, the non Manhattan post processor will make such adjustments. After the non Manhattan post processing, the non Manhattan optimized layout is ready to be routed with a non Manhattan based router at step 640.

Non Manhattan Post Processing

One type of non Manhattan post processor is a local optimizing post processor that examines the local area around each circuit cell to determine if any changes can be made to improve the placement. The local optimizing post processor takes into consideration the use of non Manhattan wiring when testing metrics such as wire length and wiring congestion. When a change that results in an overall cost improvement is found, the post processor makes the change.

Figure 7:
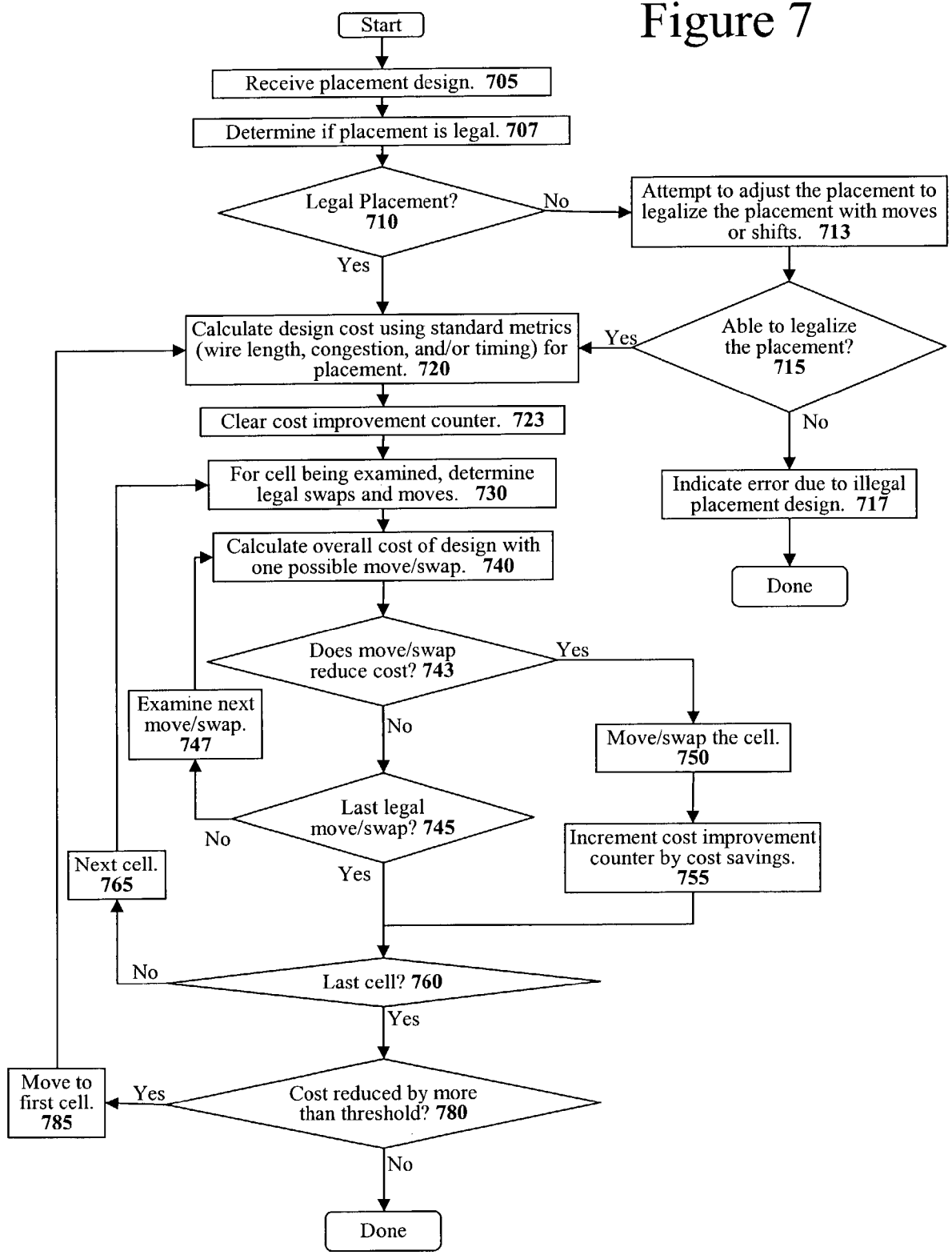
FIG. 7 illustrates a flow diagram that describes a method of processing a placement received from a Manhattan based placer to create an improved placement for a non Manhattan based integrated circuit.

FIG. 7 illustrates a flow diagram describing one embodiment of a local optimizing post processor that may be used to optimize a Manhattan placement for a non Manhattan integrated circuit. The local optimizing post processor of FIG. 7 will be described with reference to FIGS. 8, 9, and 10.

Referring to FIG. 7, the non Manhattan post processor receives a placement layout from a Manhattan placer at step 705. At step 707, the non Manhattan post processor first examines the placement to determine if it is legal. Referring back to FIG. 6, the shrink and placement in step 610 may cause the Manhattan placer to place some circuits too close to each other or overlap each other. Referring back to FIG. 7, if an illegal placement is detected at step 710, then the non Manhattan post processor proceeds to step 713 to attempt to legalize the placement. The non Manhattan post processor will attempt to move or shift circuit cells in order to make the placement legal. If the non Manhattan post processor can not create a legal placement, then it will indicate an error at step 717 and quit.

If the original placement was legal in step 710 or the non Manhattan post processor was able to legalize the placement at step 715, then the non Manhattan post processor proceeds to step 720. At step 720, the non Manhattan post processor determines an overall design cost for the placement using a set of standard metrics for analyzing circuit cell placements. Specifically, the non Manhattan post processor calculates the overall non Manhattan wiring lengths and non Manhattan wiring congestion for the current placement. The non Manhattan post processor may also take into consideration timing factors. The placement design cost will be used to compare different possible placements. Details on the non Manhattan design cost are set forth in greater detail in a later section of this document.

After calculating the placement design cost at step 720, the non Manhattan post processor clears a cost improvement counter at step 723. The cost improvement counter will be used to determine how much the placement has been improved by the non Manhattan post processor.

Figure 8:
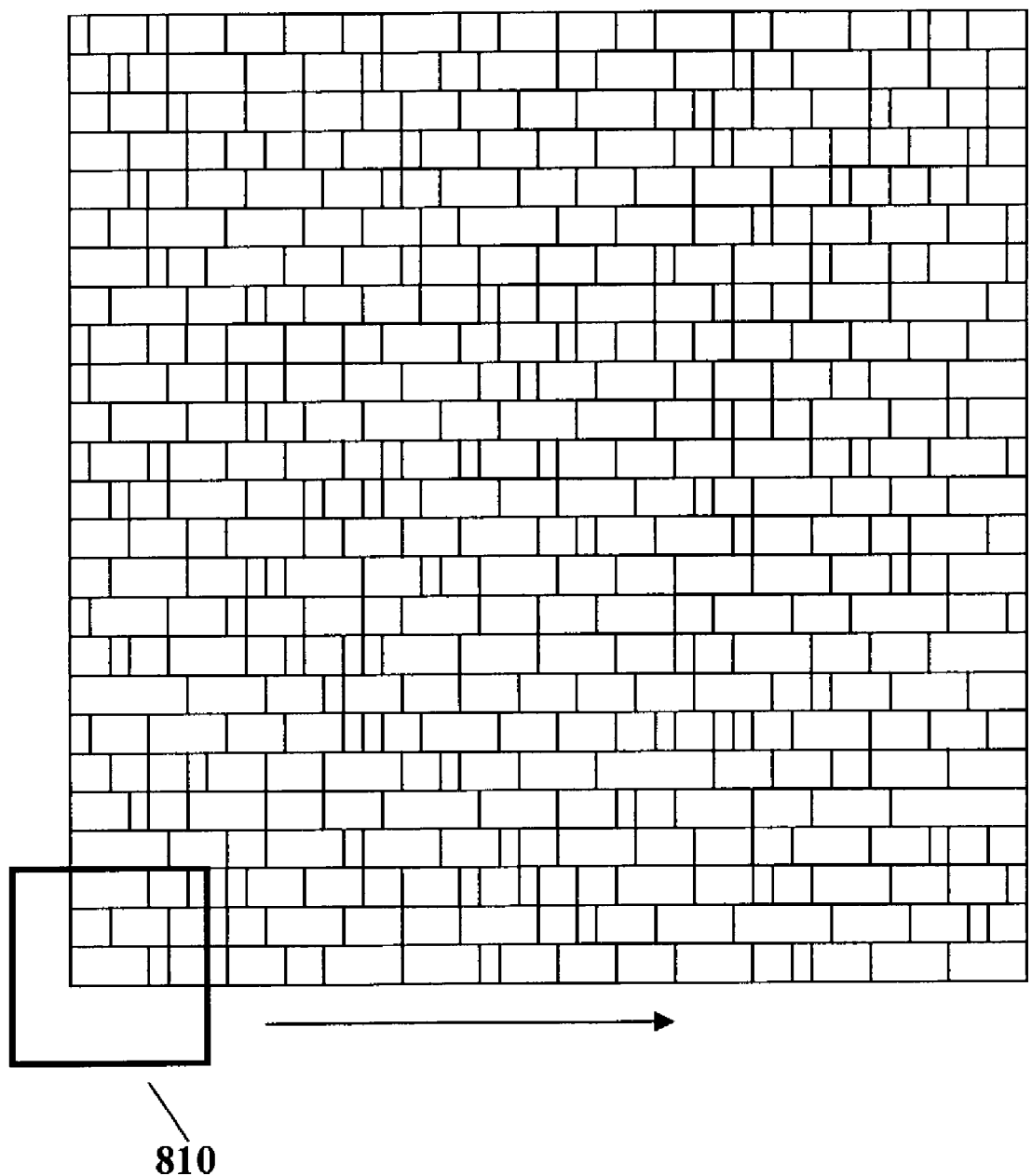
FIG. 8 graphically illustrates how a post-processor may process a local area of a Manhattan based placement for an integrated circuit.

The non Manhattan post processor then begins a scan of the entire placement layout at step 730. In one embodiment, the non Manhattan post processor begins with one corner of the integrated circuit and then scans across each circuit row as illustrated in FIG. 8. Specifically, the non Manhattan post processor examines each placed circuit cell and a local area 810 around the circuit cell to determine the legal moves or swaps that can be made for that circuit cell as specified in step 730. In the local optimizing non Manhattan post processor, only the possible moves and swaps within a local window around the circuit cell are examined.

Figure 9A:
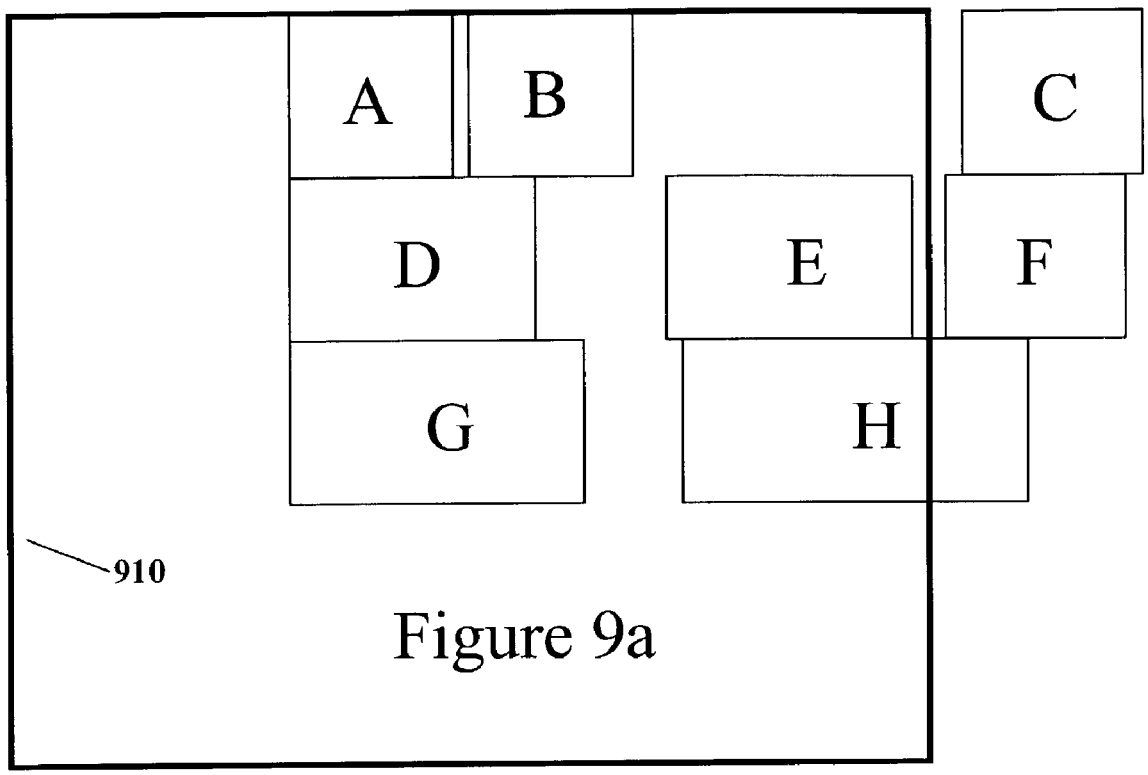
FIG. 9a graphically illustrates an example of a local window of a placement post-processor.
Figure 9B:
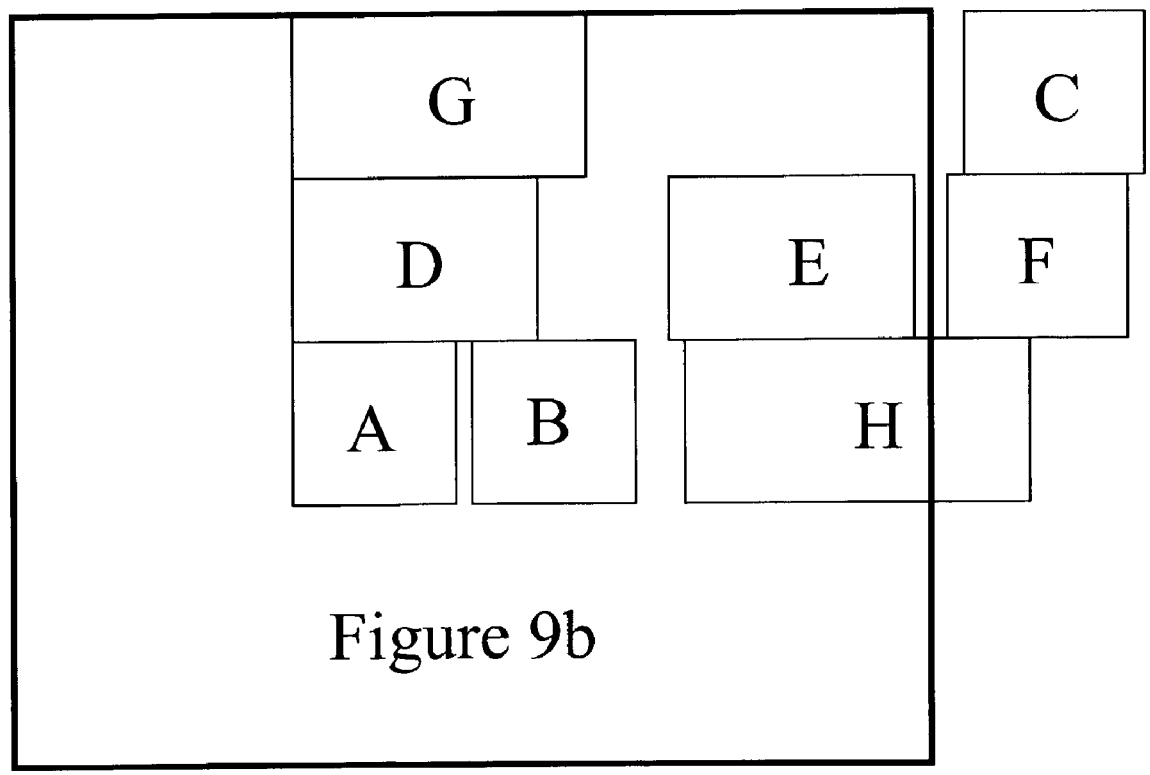
FIG. 9b graphically illustrates the example of a local window of a placement post-processor of FIG. 9b after the post-processor has swapped module G with modules A and B.

A 'move' is when a circuit cell is moved to an available open area. For example, FIG. 9a illustrates a local area window 910 around circuit cell G that is being examined. The non Manhattan post processor could move circuit cell G in FIG. 9a to the open space adjacent to circuit cell B. A swap is when the position of one circuit cell is exchanged for the position of one or more other circuit cells. For example, in FIG. 9a, the non Manhattan post processor could swap circuit cell G with circuit cell D. A swap may be made with more than one target cell. For example, in FIG. 9a, the non Manhattan post processor could swap circuit cell G with circuit cells A and B. The resulting placement would appear as illustrated in FIG. 9b.

Referring back to FIG. 7, after the non Manhattan post processor determines all the possible moves and swaps for a circuit cell at step 730, the non Manhattan post processor then begins to analyze each individual move and swap individually. Specifically, in step 740 the non Manhattan post processor calculates the overall design cost with a possible move or swap. At step 743, the non Manhattan post processor determines if the move or swap reduced the overall design cost. If it did not, then the non Manhattan post processor proceeds to step 745 where it determines if that was the last legal move or swap for the circuit cell, if not then the non Manhattan post processor proceeds to step 747 to examine to the next legal move or swap and calculate the overall design cost with that move or swap at step 745.

Referring back to step 743, if the non Manhattan post processor determines that one of the legal moves or swaps reduces the overall design cost then the non Manhattan post processor proceeds to step 750 where it changes the placement layout by performing the actually move or swap of the circuit cell. The non Manhattan post processor then increments the cost improvement counter by the cost savings at step 755.

Thus, steps 740 to 755 examine the possible legal moves and swaps for a circuit cell and perform the first move or swap that reduces the overall design cost. If no move or swap reduces the overall design cost then no change will be made. In an alternate embodiment, the design costs for all the possible moves and swaps are examined and the move or swap with the best design cost savings will be made.

After a move or swap of circuit cell has been performed (or no move or swap reduces the cost), then the non Manhattan post processor proceeds to step 760 where it determines if this is the last cell to be examined. If it is not the last cell, the non Manhattan post processor proceeds to step 765 to examine the next circuit cell. As set forth with reference to FIG. 8, the non Manhattan post processor scans across the entire integrated circuit layout until every circuit cell has been examined.

After attempting to perform a local optimization for ever circuit cell on the integrated circuit layout, the non Manhattan post processor proceeds to step 780. At step 780, the non Manhattan post processor examines the cost improvement counter to determine if any design cost improvements were made by the non Manhattan post processor. If the cost improvement counter indicates that the overall design cost was reduced by more than a threshold value, then the non Manhattan post processor moves to step 785 where it moves back to the first circuit cell. The non Manhattan post processor then begins to scan through the entire integrated circuit layout again starting at step 720. If at step 780 the cost improvement counter indicates that the costs were reduced by less than the threshold amount, then the non Manhattan post processor terminates.

Non Manhattan Placement Cost

To determine the placement cost of a particular design, a placement program considers the wiring cost and the congestion cost. The wiring cost is related to the length of the all the wiring used to connect the circuits. The congestion cost is the density of wiring in any one particular area. If the congestion becomes too high, it may become impossible to find a routing solution for the integrated circuit. The overall cost of a placement design may be expressed as:

Cost=Wiring_Cost*Wiring_Cost+
Congestion_Factor*Congestion_Cost

Figure 10A:
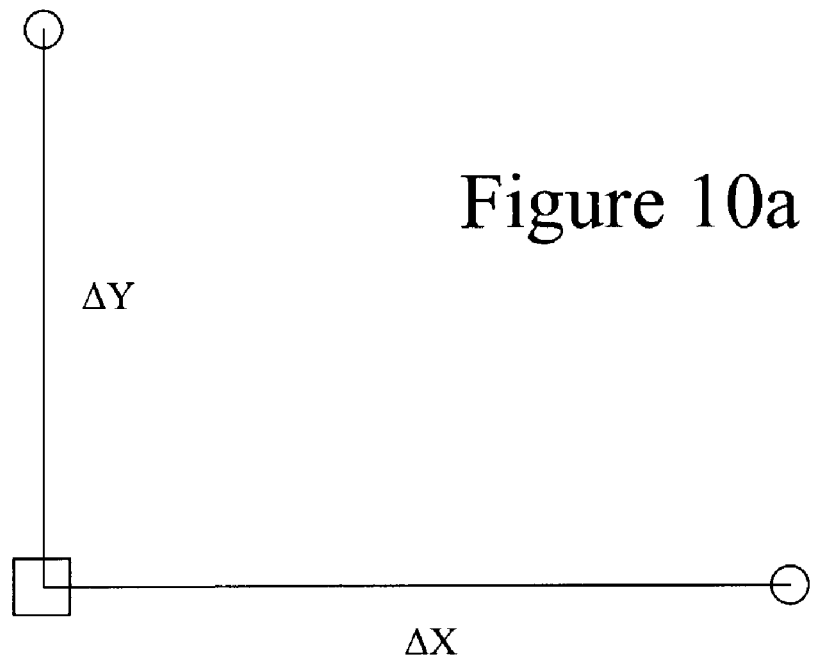
FIG. 10a graphically illustrates a Manhattan wiring length cost function between two ports.
Figure 10B:
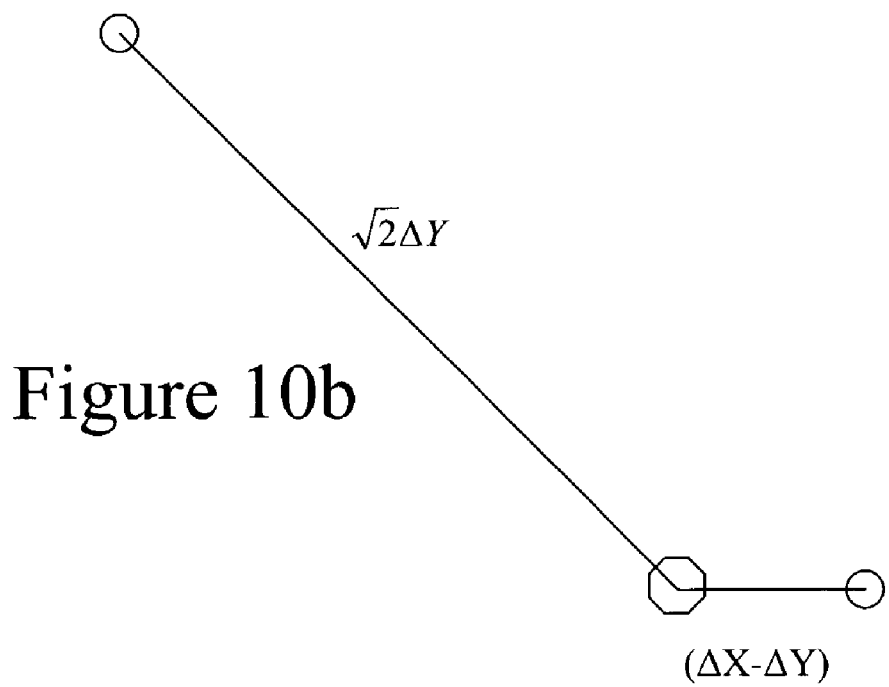

There are a number of methods of calculating the wiring cost but one of the most straight forward methods is to sum together the length of all the interconnect wiring need to wire the particular placement. In a Manhattan system, the cost of wiring two ports is the horizontal distance between the ports ($\Delta X$) plus the vertical distance between the two ports ($\Delta Y$) plus a cost for the via that couples the two wires (Normally wires are restricted to preferred layers such that horizontal wires are on a horizontal layer and vertical wires are on a vertical layer). FIG. 10a illustrates such a Manhattan wiring cost.

In a non Manhattan system with diagonal layers, the cost of wiring the two ports is the difference between the longer direction (the horizontal distance in FIG. 10b) and the shorter direction (the vertical distance in FIG. 10b) plus the square root of two times the shorter direction plus the cost for the via that couples the two wires. Note that the via cost of in FIG. 10a is probably less than the via cost of FIG. 10b since the vertical and horizontal layers are generally adjacent whereas horizontal and diagonal layers may not be. The post-processor uses this non Manhattan wiring cost system. For multi-pin nets, a minimum spanning tree may be used to calculate the distances. (A Steiner tree may also be used but is generally not used due to the extra calculation time need to determine a Steiner tree.)

Figure 11A:
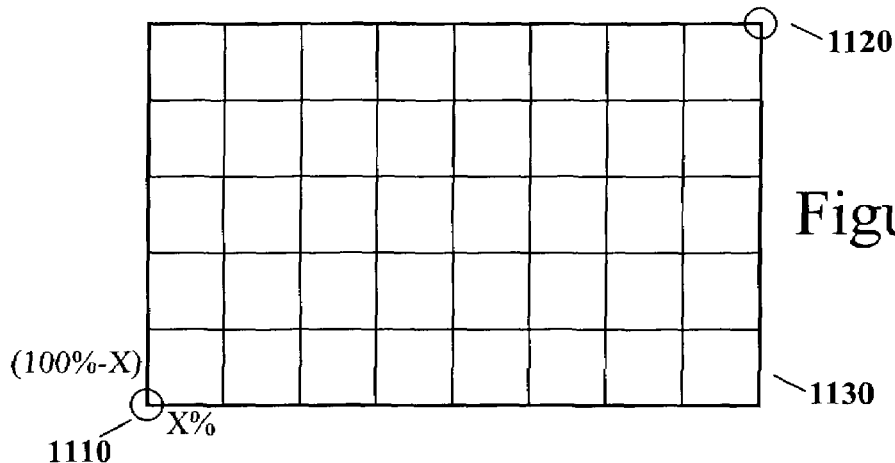
FIG. 11a illustrates a bounding box around a Manhattan routing grid that limits the routing path between two ports.

To determine the congestion cost of a particular Manhattan placement, a probabilistic routing model is employed. Specifically, at this stage of the integrated circuit layout, there has been no route created between any ports. Thus, many different possible paths may be chosen for each interconnection. For example, FIG. 11a illustrates port 1110 and port 1120 that need to be connected. An interconnect wire that connects port 1110 and port 1120 may travels through many different paths within bounding box 1130. (Actually, a router may route outside of the box to avoid congestion or an obstacle but the assumption is that the route will be in the bounding box.) Thus, a probabilistic model is constructed as is well known in the art. For example, starting from port 1110, there is a X % chance that the interconnect wire may be horizontal and a (100–X)% chance that the interconnect wire may be vertical. The sum of probabilities along a wiring direction will equal the distance along that direction. The determination of the probabilities is well known in the art.

The probability of a wire passing across a particular global routing area edge is added to a probabilistic congestion factor for that global routing area edge. By creating a probabilistic model for each individual interconnect wire, a complete congestion model for a global routing area may be created by adding together the probabilistic congestion factor from each interconnect wire for that global routing area. A congestion score for a global routing edge may be calculated as the congestion capacity minus the congestion factor but greater than 0.

A complete congestion score for the entire integrated circuit may be calculated by combining the individual congestion scores for each global routing area. In one embodiment, the overall congestion cost is calculated by adding the square of each global routing area congestion score. Specifically, the total congestion cost of an integrated circuit with N global routing areas may be given by:

IC_Congestion Cost=(Area_1_Congestion)$^2$+(Area_2_Congestion)$^2$+ . . . +(Area_N_Congestion)$^2$ To calculate the congestion score for a non Manhattan system, the congestion must take into account diagonal wires. In one embodiment, each global routing area is given a diagonal routing capacity that is equal to the capacity of a square global routing area edge (horizontal or vertical) divided by the square-root of two as set forth below:

$$\text{Diagonal\_Capacity} = \frac{\text{Horizontal\_Capacity}}{\sqrt{2}} = \frac{\text{Vertical\_Capacity}}{\sqrt{2}}$$

Figure 11B:
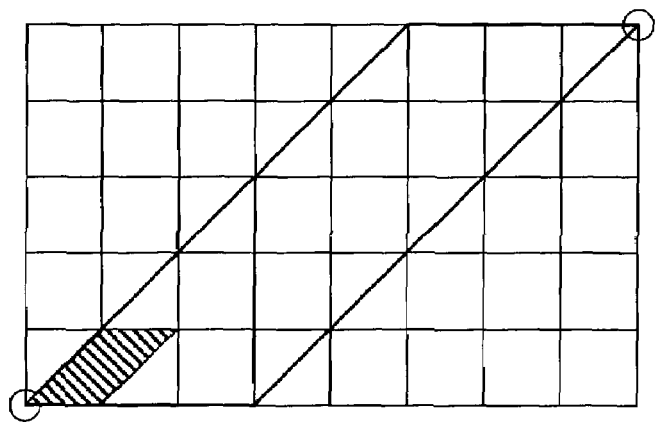
FIG. 11b illustrates the routing problem of FIG. 11a with an additional diagonal routing bounding box.
Figure 11C:
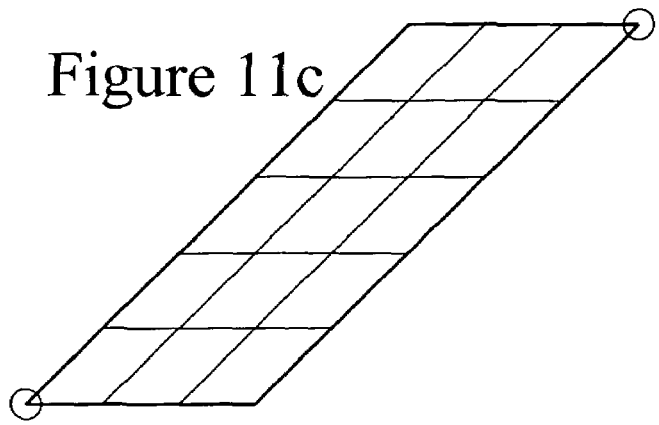
FIG. 11c illustrates the diagonal routing bounding box of FIG. 11b with a diagonal routing grid.
Figure 11D:
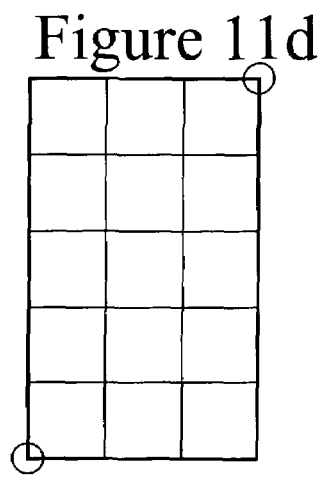
FIG. 11d illustrates the diagonal routing problem of FIG. 11c transformed into a Manhattan routing problem.

Then, the probabilistic routing model takes into account the ability to route diagonal wires. FIG. 11b illustrates the routing problem of FIG. 11a with a second bounding box for diagonal routing added. To handle diagonal wiring, a diagonal wiring grid may be used. FIG. 11c illustrates the diagonal bounding box of FIG. 11b with a diagonal routing grid added. The diagonal routing grid of FIG. 11c can be handled in the same manner as the normal horizontal & vertical grids. Specifically, FIG. 11d illustrates a transformed version of FIG. 11c. Thus, the same software for creating the probabilistic congestion models for Manhattan routing can be used for non Manhattan routing by adding a diagonal congestion capacity that is equal to the horizontal capacity divided by the square-root of two.

The foregoing has described methods and apparatus for routing interconnect lines for an integrated circuit ("IC") in a gridless non Manhattan manner. It is contemplated that changes and modifications may be made by one of ordinary skill in the art, to the materials and arrangements of elements of the present invention without departing from the scope of the invention.

The invention claimed is:

1. A method of designing an integrated circuit ("IC") layout, said method comprising:
    processing the IC layout with a Manhattan based placement program to produce an initial placement of the IC layout;
    processing said initial placement with a non Manhattan based post processor to produce a non Manhattan based placement of the IC layout, wherein the processing of the initial placement is performed before a non Manhattan based routing; and
    performing the non Manhattan based routing after processing the initial placement with the non Manhattan based post processor, wherein the non Manhattan based routing defines routes for a plurality of nets of the IC layout that did not have defined routes after the processing by the non Manhattan based post processor of the initial placement.

2. The method as claimed in claim 1, said method further comprising:
    reducing a die size for said initial placement.

3. The method as claimed in claim 1, wherein said non Manhattan based post processor considers a timing placement metric.

4. The method as claimed in claim 3 wherein said non Manhattan based post processor considers non Manhattan wiring lengths.

5. The method as claimed in claim 1, said method further comprising:
    processing a logical design with a Manhattan based placement program to create an initial die size; and
    reducing said initial die size.

6. The method as claimed in claim 1, wherein said non Manhattan based post processor considers non Manhattan wiring lengths.

7. The method as claimed in claim 1, wherein said non Manhattan based post processor considers non Manhattan congestion.

8. The method as claimed in claim 6, wherein said non Manhattan based post processor considers non Manhattan congestion.

9. The method as claimed in claim 1, wherein said non Manhattan based post processor considers swaps and moves of circuit modules.

10. A computer readable medium, said computer readable medium comprising a set of computer instructions for an integrated circuit ("IC") layout, said computer instructions implementing the steps of:
    processing the IC layout with a Manhattan based placement program to produce an initial placement of the IC layout;
    processing said initial placement with a non Manhattan based post processor to produce a non Manhattan based placement of the IC layout, wherein the processing of the initial placement is performed before a non Manhattan based routing; and
    performing the non Manhattan based routing after processing the initial placement with the non Manhattan based post processor, wherein the non Manhattan based routing defines routes for a plurality of nets of the IC layout that did not have defined routes after the processing by the non Manhattan based post processor of the initial placement.

11. The computer readable medium as claimed in claim 10, said computer instructions further implementing:
    reducing a die size for said initial placement.

12. The computer readable medium as claimed in claim 10, wherein said non Manhattan based post processor considers a timing placement metric.

13. The computer readable medium as claimed in claim 12, wherein said non Manhattan based post processor considers non Manhattan wiring lengths.

14. The computer readable medium as claimed in claim 10, said computer instructions further implementing:
    processing a logical design with a Manhattan based placement program to create an initial die size; and
    reducing said initial die size.

15. The computer readable medium as claimed in claim 10, wherein said non Manhattan based post processor considers non Manhattan wiring lengths.

16. The computer readable medium as claimed in claim 10, wherein said non Manhattan based post processor considers non Manhattan congestion.

17. The computer readable medium as claimed in claim 15, wherein said non Manhattan based post processor considers non Manhattan congestion.

18. The computer readable medium as claimed in claim 10, wherein said non Manhattan based post processor considers swaps and moves of circuit modules.

* * * * *